US012372867B2

(12) United States Patent
Thackeray et al.

(10) Patent No.: US 12,372,867 B2
(45) Date of Patent: Jul. 29, 2025

(54) PHOTORESISTS COMPRISING MULTIPLE ACID GENERATOR COMPOUNDS

(71) Applicant: Rohm and Haas Electronic Materials LLC, Marlborough, MA (US)

(72) Inventors: James W. Thackeray, Braintree, MA (US); Jin Wuk Sung, Worcester, MA (US); Paul J. LaBeaume, Auburn, MA (US); Vipul Jain, North Grafton, MA (US)

(73) Assignee: DUPONT ELECTRONIC MATERIALS INTERNATIONAL, LLC, Marlborough, MA (US)

( * ) Notice: Subject to any disclaimer, the term of this patent is extended or adjusted under 35 U.S.C. 154(b) by 0 days.

(21) Appl. No.: 14/027,400

(22) Filed: Sep. 16, 2013

(65) Prior Publication Data

US 2014/0080062 A1 Mar. 20, 2014

Related U.S. Application Data

(60) Provisional application No. 61/701,588, filed on Sep. 15, 2012.

(51) Int. Cl.
*G03F 7/004* (2006.01)
*G03F 7/039* (2006.01)
*G03F 7/20* (2006.01)

(52) U.S. Cl.
CPC .......... *G03F 7/0045* (2013.01); *G03F 7/0046* (2013.01); *G03F 7/0392* (2013.01); *G03F 7/0397* (2013.01); *G03F 7/20* (2013.01)

(58) Field of Classification Search
None
See application file for complete search history.

(56) References Cited

U.S. PATENT DOCUMENTS

| | | | |
|---|---|---|---|
| 5,128,232 A | 7/1992 | Thackeray et al. | |
| 7,459,260 B2 | 12/2008 | Chandhok et al. | |
| 8,318,403 B2 | 11/2012 | Ichikawa et al. | |
| 2003/0008230 A1 | 1/2003 | Li et al. | |
| 2007/0224540 A1 | 9/2007 | Kamimura et al. | |
| 2008/0311522 A1* | 12/2008 | Iwai | C07C 309/04 430/286.1 |
| 2010/0104973 A1 | 4/2010 | Kawaue et al. | |
| 2010/0248149 A1* | 9/2010 | Tsuchimura | C08F 224/00 430/296 |
| 2011/0189607 A1* | 8/2011 | Ohashi | C07C 69/54 430/270.1 |
| 2011/0244392 A1* | 10/2011 | Hirano et al. | 430/270.1 |
| 2011/0294069 A1 | 12/2011 | Bae et al. | |
| 2012/0214100 A1* | 8/2012 | Kobayashi et al. | 430/285.1 |
| 2012/0282551 A1* | 11/2012 | Matsuzawa et al. | 430/296 |

FOREIGN PATENT DOCUMENTS

| | | | | |
|---|---|---|---|---|
| EP | 0164248 A2 | | 12/1985 | |
| EP | 0783136 A2 | | 7/1997 | |
| EP | 0829766 A2 | | 3/1998 | |
| EP | 1906241 A1 | | 4/2008 | |
| JP | 2009080161 A | | 4/2009 | |
| JP | 2010250290 A | | 11/2010 | |
| JP | 2011039128 A | | 2/2011 | |
| JP | 2012048075 A | * | 3/2012 | |
| JP | 2012173479 A | | 9/2012 | |
| JP | 2012173642 A | * | 9/2012 | |
| JP | 2013250431 A | | 12/2013 | |
| JP | 2013250433 A | | 12/2013 | |
| WO | WO-2013047091 A1 | * | 4/2013 | G03F 7/0045 |

OTHER PUBLICATIONS

Machine translation JP 2012-048075. Mar. 8, 2012. (Year: 2012).*
Japanese Office Action dated Oct. 6, 2014 for Japanese Application No. JP2013-190011.
Japanese Office Action dated May 28, 2015 for Japanese Application No. JP2013-190011.

* cited by examiner

Primary Examiner — In Suk C Bullock
Assistant Examiner — Alyssa L Cepluch
(74) Attorney, Agent, or Firm — CANTOR COLBURN LLP

(57) ABSTRACT

The present invention relates to new photoresist compositions that comprise (a) a polymer comprising an acid generator bonded thereto; and (b) an acid generator compound that is not bonded to the polymer and that comprises one or more acid-labile groups.

11 Claims, No Drawings

PHOTORESISTS COMPRISING MULTIPLE ACID GENERATOR COMPOUNDS This application claims the benefit of priority under 35 U.S.C. § 119 (e) to U.S. Provisional Application No. 61/701,588, filed Sep. 15, 2013, the entire contents of which application are incorporated herein by reference.

1. FIELD

The present invention relates to new photoresist compositions that comprise two or more distinct acid generator compounds, particularly (a) a polymer comprising an acid generator bonded thereto; and (b) an acid generator compound that is not bonded to the polymer and that comprises one or more acid-labile groups.

2. INTRODUCTION

Photoresists are photosensitive films for transfer of images to a substrate. They form negative or positive images. After coating a photoresist on a substrate, the coating is exposed through a patterned photomask to a source of activating energy such as ultraviolet light to form a latent image in the photoresist coating. The photomask has areas opaque and transparent to activating radiation that define an image desired to be transferred to the underlying substrate. A relief image is provided by development of the latent image pattern in the resist coating.

Known photoresists can provide features having resolution and dimension sufficient for many existing commercial applications. However for many other applications, the need exists for new photoresists that can provide highly resolved images of submicron dimension.

Various attempts have been made to alter the make-up of photoresist compositions to improve performance of functional properties. Among other things, a variety of photoactive compounds have been reported for use in photoresist compositions. See US 20070224540 and EP 1906241. Extreme ultraviolet (EUV) and e-beam imaging technologies also have been employed. See U.S. Pat. No. 7,459,260. EUV utilizes short wavelength radiation, typically between 1 nm to 40 nm, with 13.5 nm radiation often employed.

EUV photoresist development continues to be a challenging issue for EUV Lithography (EUVL) technology implementation. Required are development of materials that can provided highly resolved fine features, including low linewidth roughness (LWR), and sufficient sensitivity to afford wafer throughput.

SUMMARY

We have now discovered new photoresist compositions that comprise an acid generator component with multiple distinct acid generator compounds. In particular, we provide photoresist compositions that comprise (a) a polymer comprising an acid generator bonded thereto; and (b) an acid generator compound that is not bonded to the polymer and that comprises one or more acid-labile groups.

In preferred aspects, acid generator compounds and photoresist compositions of the invention are particularly useful for EUV imaging.

In one preferred aspect, photoresist compositions are provided that comprise (a) a polymer comprising an acid generator bonded thereto; and (b) an acid generator compound that is not bonded to the polymer and that comprises one or more acid-labile groups. In such aspects, the photoresist composition suitably need not comprise an additional polymer distinct from the (a) polymer comprising an acid generator bonded thereto. That is, the (a) polymer comprising an acid generator bonded thereto may be a matrix polymer of the photoresist composition. Thus, for example in the case of a positive-acting photoresist, the (a) polymer comprising an acid generator bonded thereto may further comprise repeat units that comprise acid-labile groups such as acid-labile ester or acetal groups.

In another preferred aspect, photoresist compositions are provided that comprise: (a) a polymer; and (b) an acid generator component that comprises (i) a first non-polymeric acid generator compound that comprises one or more covalently linked acid-labile groups; and (ii) a second polymeric acid generator compound that is distinct from the first acid generator compound and the (a) polymer. For chemically-amplified positive photoresists, the (a) polymer suitably comprises acid-labile groups, such as acid-labile ester or acetal groups. The second polymeric acid generator compound also may comprise acid-labile groups, such as acid-labile ester or acetal groups.

The polymeric and non-polymeric acid generator compounds suitably may be a variety of ionic and non-ionic acid generators such as onium compounds, a sulfonate compound, a disulfone, a diazosulfone, an α,α-methylenedisulfone, or a disulfonylhydrazine, with onium compounds being generally preferred, particularly acid generators comprising sulfonium and/or iodonium groups. Acid generator compounds comprising a dibenzothiophene moiety and/or thioxanthone moiety can be especially preferred.

In cases where the polymeric acid generator compound is ionic, suitably the anion component but not the cation component of the acid generator compound may be covalently linked to a polymer, or the cation component but not the anion component of the acid generator may be covalently linked to a polymer, or each of the anion and cation components of the acid generator may be covalently linked to a polymer.

Preferably, one or both of the polymeric acid generator compound and non-polymeric acid generator compound comprises a covalently linked acid-labile group. In certain preferred aspects, the non-polymeric acid generator will be ionic and will comprise an acid-labile moiety covalently linked to a cation component of the acid generator compound.

We also have found that use of a high relative weight amount of the non-polymeric acid generator can provide enhanced lithographic results, including good line edge roughness and contrast of a formed resist relief image.

Particularly preferred photoresists of the invention may comprise an imaging-effective amount of one or more acid generator compounds as disclosed herein and a suitable polymer component.

Admixtures or blends of two or more distinct acid generator compounds as disclosed herein also are provided, including blends or admixture that comprise (i) a non-polymeric acid generator compound that comprises one or more covalently linked acid-labile groups; and (ii) a polymeric acid generator compound Methods are also provided for forming relief images of photoresist compositions of the invention (including patterned lines with sub sub-50 nm or sub-20 nm dimensions). Substrates such as a microelectronic wafer also are provided having coated thereon a photoresist composition of the invention.

DETAILED DESCRIPTION

Acid Generator Compounds

As referred to herein, acid generator compounds can produce an acid when exposed to activating radiation, such as EUV radiation, e-beam radiation or other radiation sources such as 193 nm wavelength radiation. Acid generator compounds as referred to herein also may be referred to as photoacid generator compounds.

Preferred polymeric and non-polymeric acid generator compounds of photoresists of the invention may comprise a structure of Formula (I):

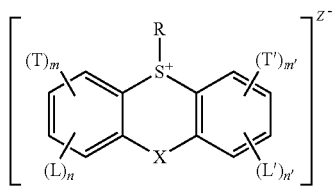

(I)

wherein: Z is a counter anion;
R is a non-hydrogen substituent;
X is >C=O; >S(O); >S(O)2; —C(=O)O—; —C(=O)NH—; —C(=O)—C(=O)—; —O—; CHOH; CH2; or S, or X is a single bond (to provide a 5-membered ring); each T and each T' are the same or different non-hydrogen substituent;
each L and each L' are the same or different acid-labile group, with T, L, T' and L' non-hydrogen groups may be taken together to form a ring;
m and m' are each independently 0 (where hydrogen would be present for the T or T'), 1, 2, 3 or 4; and n and n' are each independently 0 (where hydrogen would be present for the L or L'), 1, 2, 3 or 4, wherein if R does not comprise an acid-labile group, then at least one of n an n' is greater than zero whereby the acid generator compound comprises at least one acid-labile group. In certain preferred aspects, preferably one or both of m and m' are 0.

Particularly preferred polymeric and non-polymeric acid generator compounds of photoresist compositions of the invention include compounds that comprise a structure of the following Formula (IA):

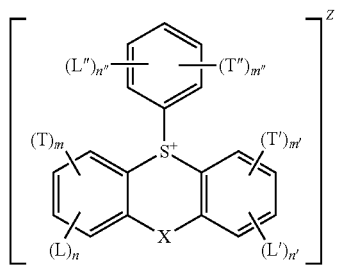

(IA)

wherein: Z is a counter anion;
X is >C=O; >S(O); >S(O)2; —C(=O)O—; —C(=O)NH—; —C(=O)—C(=O)—; —O—; CHOH; CH2; or S, or X is a single bond (to provide a 5-membered ring); each T, each T' and each T" are the same or different non-hydrogen substituent; each L, each L' and each L" are the same or different acid-labile group, with T, L, T', L', T" and L" non-hydrogen groups may be taken together to form a ring;
m and m' are each independently 0 (where hydrogen would be present for the T or T'), 1, 2, 3 or 4; m" is 0 (where hydrogen would be present for the T"), 1, 2, 3, 4 or 5; n and n' are each independently 0 (where hydrogen would be present for the L or L'), 1, 2, 3 or 4; n" is independently 0 (where hydrogen would be present for the L"), 1, 2, 3, 4 or 5; and at least one of n, n' and n" are other than 0. In certain preferred aspects, preferably one or more of m, m' and m" are 0.

Additional preferred polymeric and non-polymeric acid generator compounds of photoresist compositions of the invention include compounds that comprise a structure of the following Formula (IB):

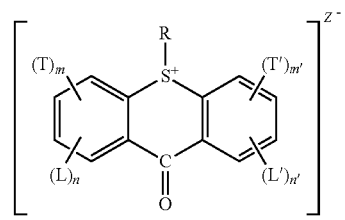

(IB)

wherein:
Z is a counter anion;
R is a non-hydrogen substituent;
each T and each T' are the same or different non-hydrogen substituent;
each L and each L' are the same or different acid-labile group, with T, L, T' and L' non-hydrogen groups may be taken together to form a ring;
m and m' are each independently 0 (where hydrogen would be present for the T or T'), 1, 2, 3 or 4; and n and n' are each independently 0 (where hydrogen would be present for the L or L'), 1, 2, 3 or 4. In certain preferred aspects, preferably one or both of m and m' are 0.

In the above Formulae (I), (IA) and (IB) as well as Formulae (II) and (III) below suitable non-hydrogen substituents may be e.g halo (F, Cl, Br or I), cyano, nitro, hydroxy, optionally substituted $C_{1-20}$alkyl, optionally substituted $C_{1-20}$alkoxy, such as optionally substituted alkyl (e.g. optionally substituted $C_{1-10}$ alkyl), optionally substituted alkenyl or alkynyl preferably having 2 to about 20 carbon atoms such as allyl; optionally substituted ketones preferably having 1 to about 20 carbon atoms; optionally substituted alkylthio preferably having 1 to about 20 carbon atoms; optionally substituted alkylsulfinyl preferably 1 to about 20 carbon atoms; optionally substituted alkylsulfonyl preferably having 1 to about 20 carbon atoms; optionally substituted carboxy preferably have 1 to about 20 carbon atoms (which includes groups such as —COOR' where R' is H or $C_{1-8}$alkyl, including esters that are substantially non-reactive with photoacid); optionally substituted alkaryl such as optionally substituted benzyl, optionally substituted carbocyclic aryl such as optionally substituted phenyl, naphthyl, acenaphthyl, or optionally substituted heteroalicyclic or heteroaromatic group such as pyridyl, furanyl, pyrrole, thiophene, furan, imidazole, pyrazole, oxazole, isoxazole, thiazole, isothiazole, triazole, furanzan, oxadiazole, thiadiazole, dithiazole, terazole, pyran, thiopyran, diazine, oxazine, thiazine, dioxine, dithine, and triazine and polyaromatic groups containing one or more of such moieties. Additionally, multiple substituents (e.g. two T or T' substituents present on adjacent carbons in any of the above formulae) may be taken together to form a ring such as a fused optionally substituted phenyl ring.

In the above Formulae (I) and (IA) preferred X groups include >C=O; >S(O); >S(O)2; —C(=O)O—; —C(=O)NH—; —C(=O)—C(=O)—; —O—; CHOH; or S, or a single bond; more preferably X may be C=O; >S(O); >S(O)$_2$; —C(=O)O—; —C(=O)NH—; —C(=O)—C(=O)—; —O—; or S, or a single bond; still more preferably X may be any one of C=O; >S(O); >S(O)2; —C(=O)O—; or —C(=O)—C(=O)—; or a single bond. >C=O and a single bond are particularly preferred X groups of the above Formulae (I) and (IA).

As discussed above, preferably one or both of the first and second acid generator compounds comprises a covalently linked acid-labile group. Suitable acid-labile groups of acid generator compounds may be a variety of moieties, including acid-labile esters and acetals such as optionally substituted ethylcyclopentyl ester, methyladamantyl ester, ethyl adamantyl ester, t-butylester, phenyl ester, naphthyl ester and others. As referred to herein, acid-labile moieties or groups (including acid-labile esters and acetals) undergo reaction in the presence of generated acid (from an acid generator compound in a resist) during typical lithographic processing, including any post-radiation exposure thermal exposure. Acid-labile groups as referred to herein also may be referred to as photoacid-labile groups.

Preferred acid-labile groups of acid generators of photoresists of the invention may comprise acid-labile ester moieties such as a group of the formula —C(=O)O(CH$_2$)n(C=O)O-ALG, where n is an integer of from 1 to 12, preferably n is 1, 2, 3 or 4, and ALG is a group (e.g. that provides a quaternary carbon linked to the ester) that results in an acid labile moiety, such as t-butyl or a ring system with linking quaternary carbon such as 1-ethylcyclopentyl or methyladamantyl.

In a particular aspect, acid generator compounds of photoresists of the invention may comprise an acid-labile ester linkage of the Formula (II):

wherein in Formula (II) R$^3$ is a non-hydrogen substituent that provides an acid-labile moiety such as a carbamate, an acid-labile ester or acetal group. For instance, exemplary preferred R$^3$ groups include t-butyl, or more preferably a further ester linkage such as where R$^3$ is —(CH2)n(C=O)O-ALG, where n is an integer of from 1 to 12, preferably n is 1, 2, 3 or 4, and ALG is a group (e.g. that provides a quaternary carbon linked to the ester) that results in an acid labile moiety, such as t-butyl or a ring system with linking quaternary carbon such as 1-ethylcyclopentyl or methyladamantyl.

In another particular aspect, acid generator compounds of photoresists of the invention may comprise an acid-labile ester linkage of the Formula (III):

wherein in Formula (III) X and Y are independently hydrogen or a non-hydrogen substituent such as halogen (F, Cl, Br, I), $C_{1-10}$alkyl, $C_{1-10}$alkoxy; R$^3$ is a non-hydrogen substituent that provides an acid-labile moiety such as a carbamate, an acid-labile ester or acetal group; and n is a positive integer such as any of 1 through 20, more typically n is any of 1-10 or 1-4. Exemplary preferred R$^3$ groups include t-butyl, or more preferably a further ester linkage such as where R$^3$ is —(CH2)n(C=O)O-ALG, where n is an integer of from 1 to 12, preferably n is 1, 2, 3 or 4, and ALG is a group (e.g. that provides a quaternary carbon linked to the ester) that results in an acid labile moiety, such as t-butyl or a ring system with linking quaternary carbon such as 1-ethylcyclopentyl or methyladamantyl.

Such ester-containing acid-labile groups (such as those of Formula II) or ether-containing acid-labile groups (such as those of Formula III) can be a substituent at any various available positions of an acid generator compound. In certain preferred aspects, an ester-containing acid-labile group will be a ring substituent of a carbocyclic aryl group such as phenyl or multi-cyclic aromatic ring such as naphthyl or anthracenyl ring of an acid generator compound.

In certain aspects, an acid generator compound also may comprise multiple acid-labile groups, including multiple distinct acid-labile groups, including e.g. an acid generator compound that comprises at least one ester-containing acid-labile groups (such as those of Formula II) as well as at least one ether-containing acid-labile groups (such as those of Formula III).

Exemplary specifically preferred cation components of acid generator compounds of the present photoresist compositions include the following:

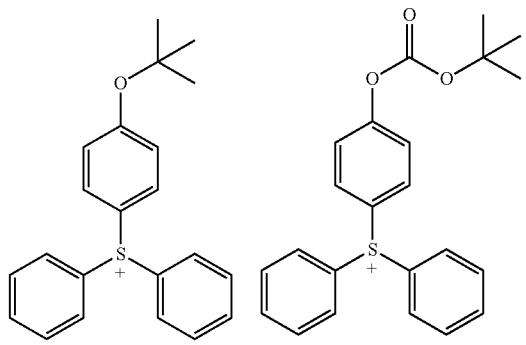

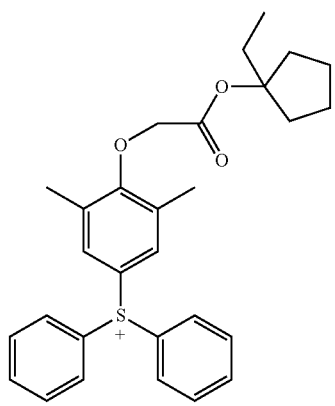

-continued
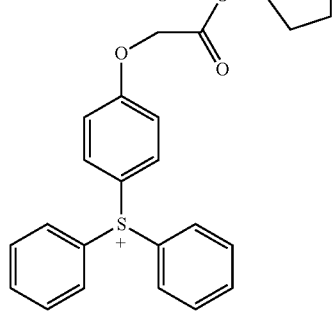
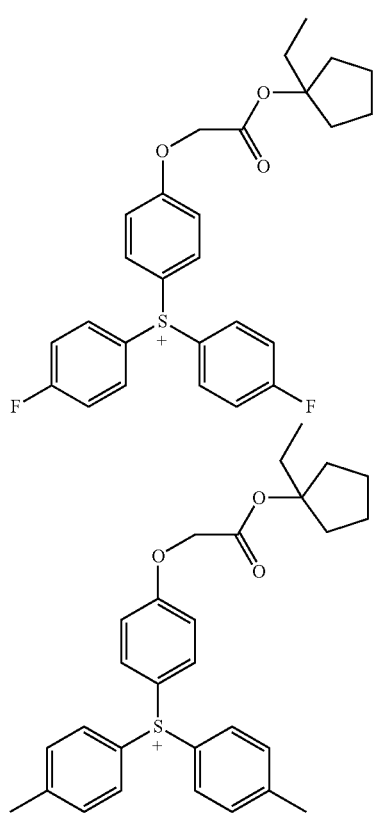
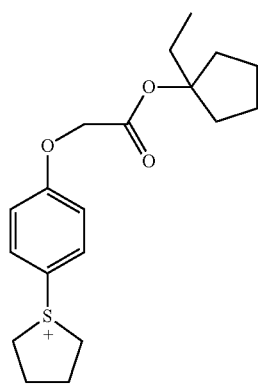
-continued
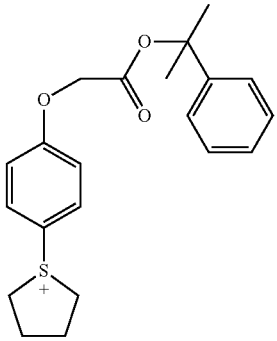
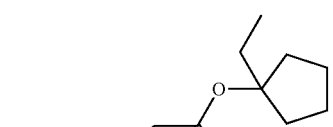
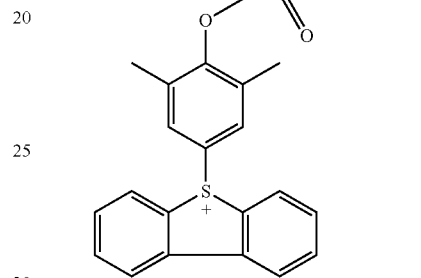
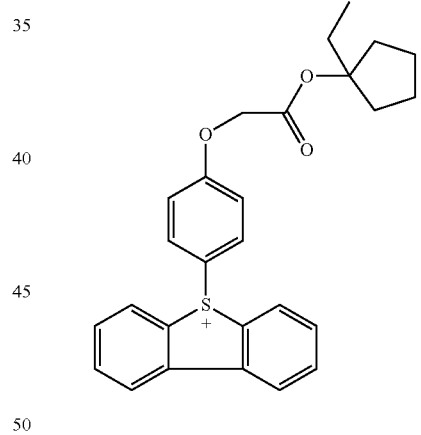
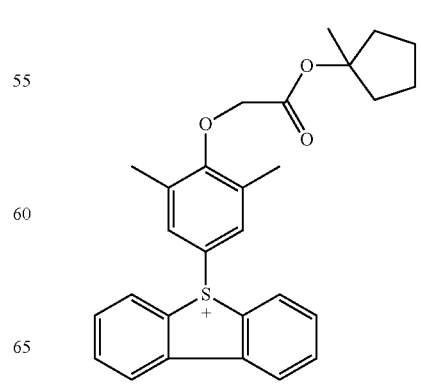

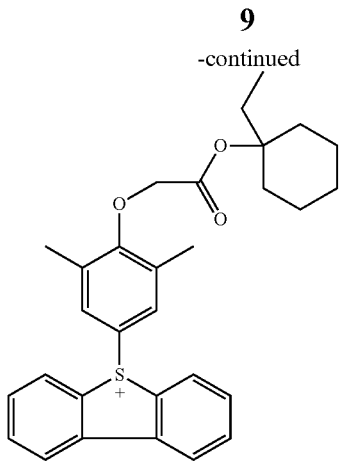
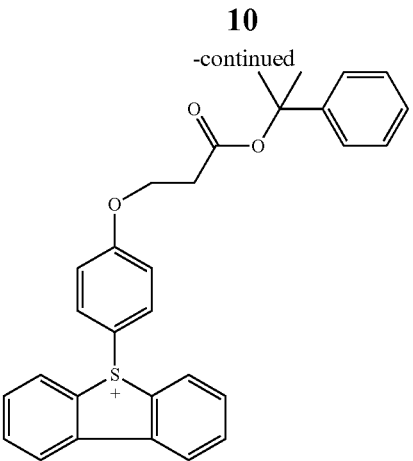
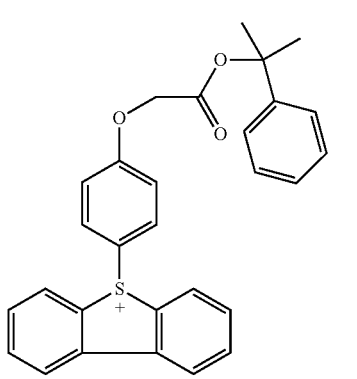
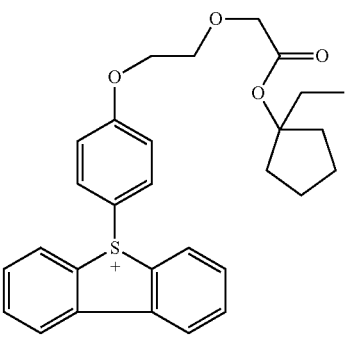
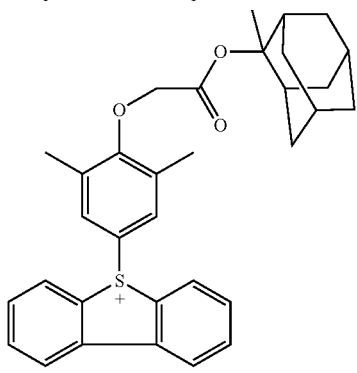
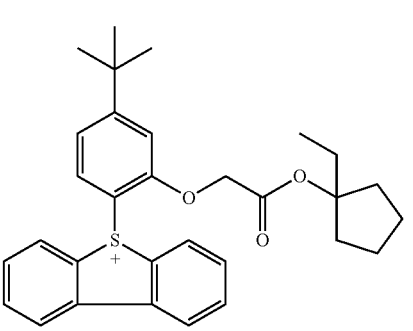
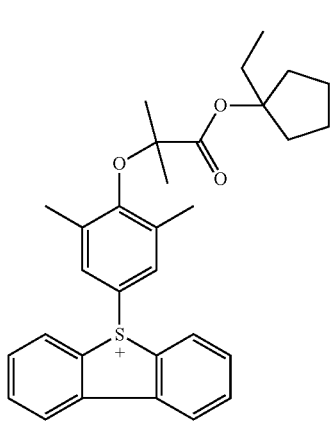
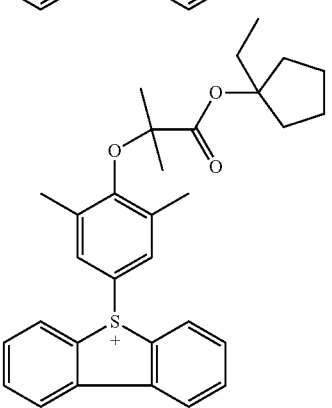

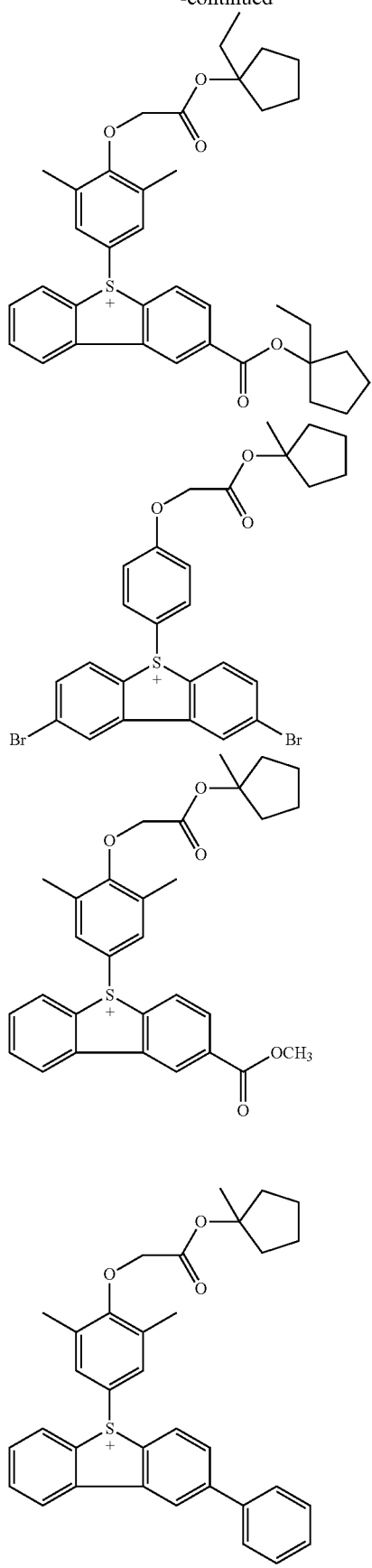
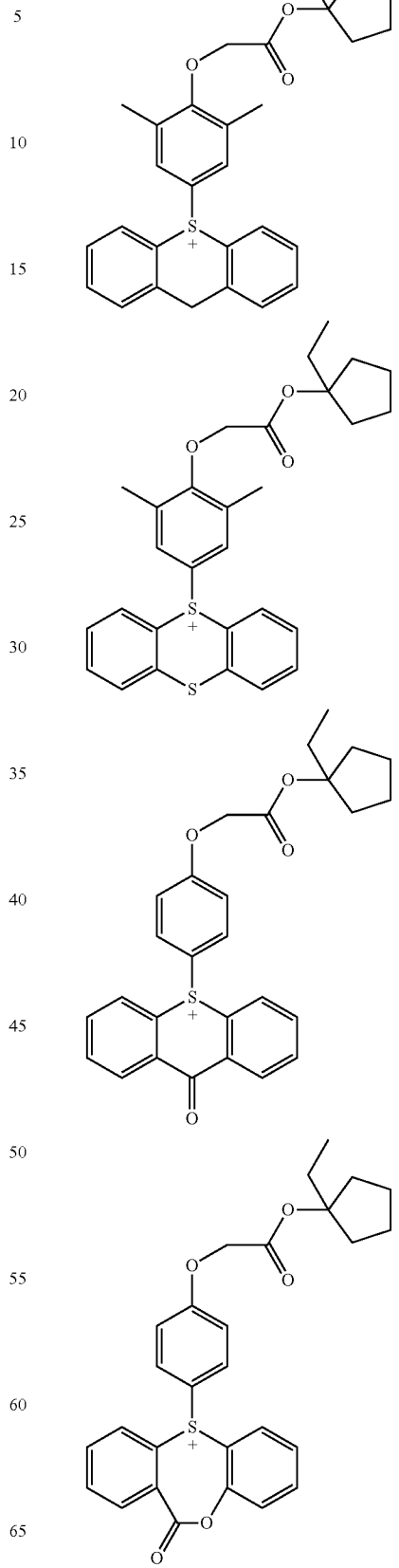

-continued
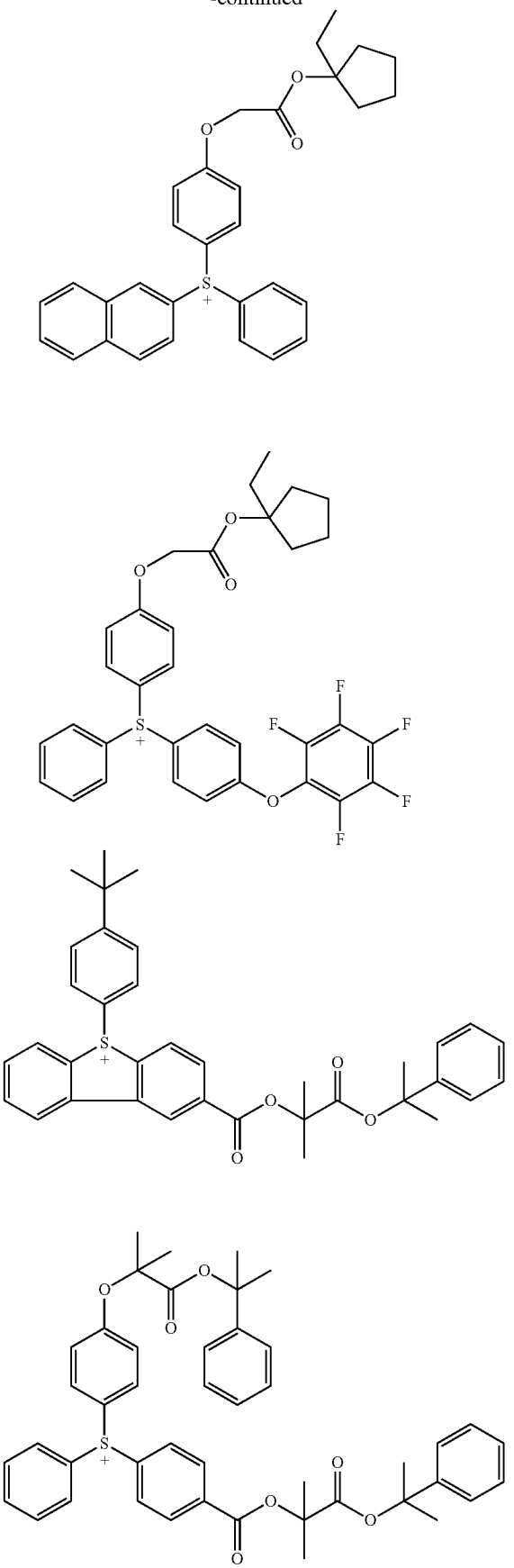
-continued
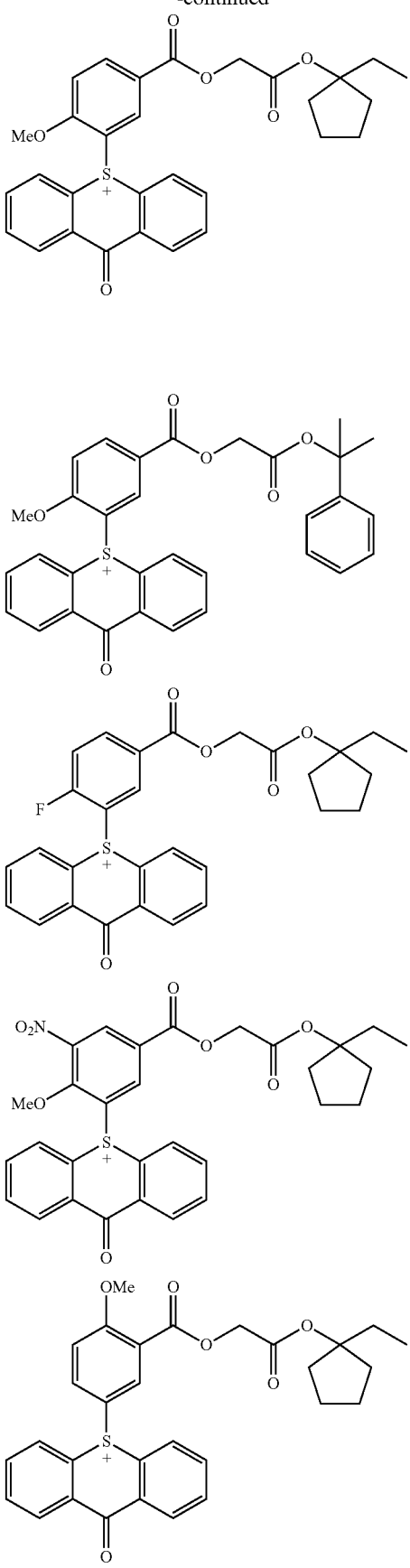

15
-continued
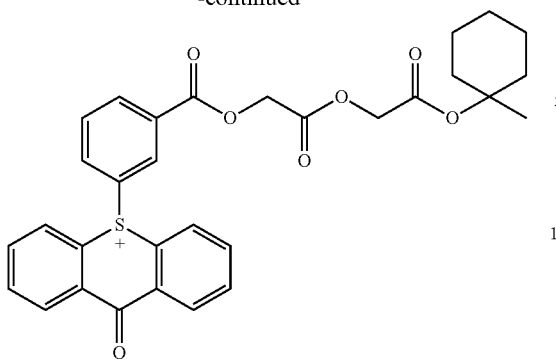
16
-continued
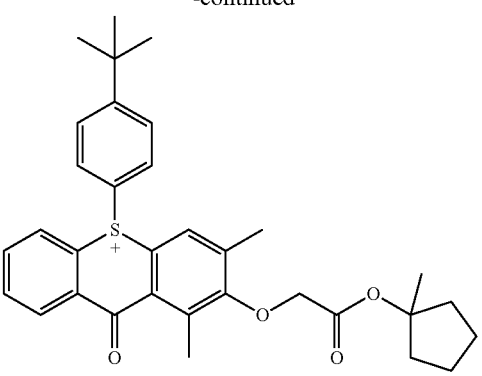
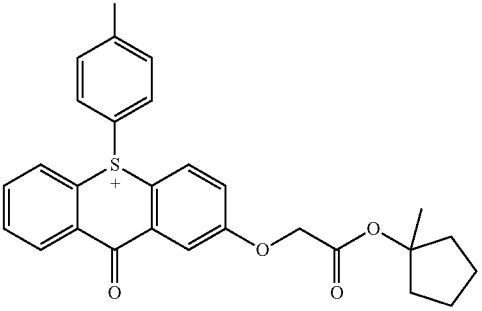
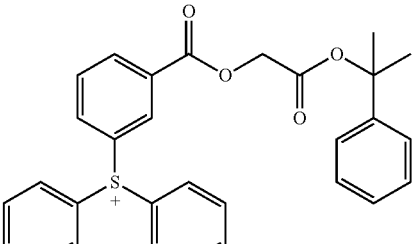
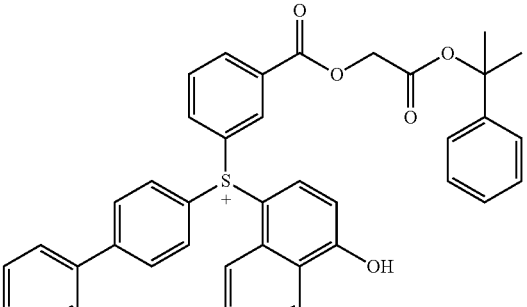
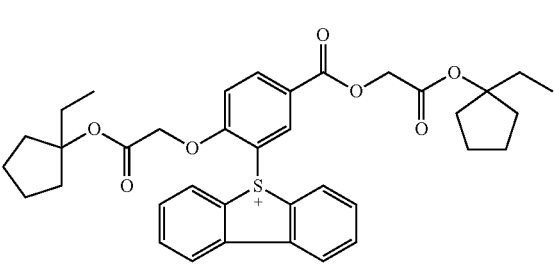

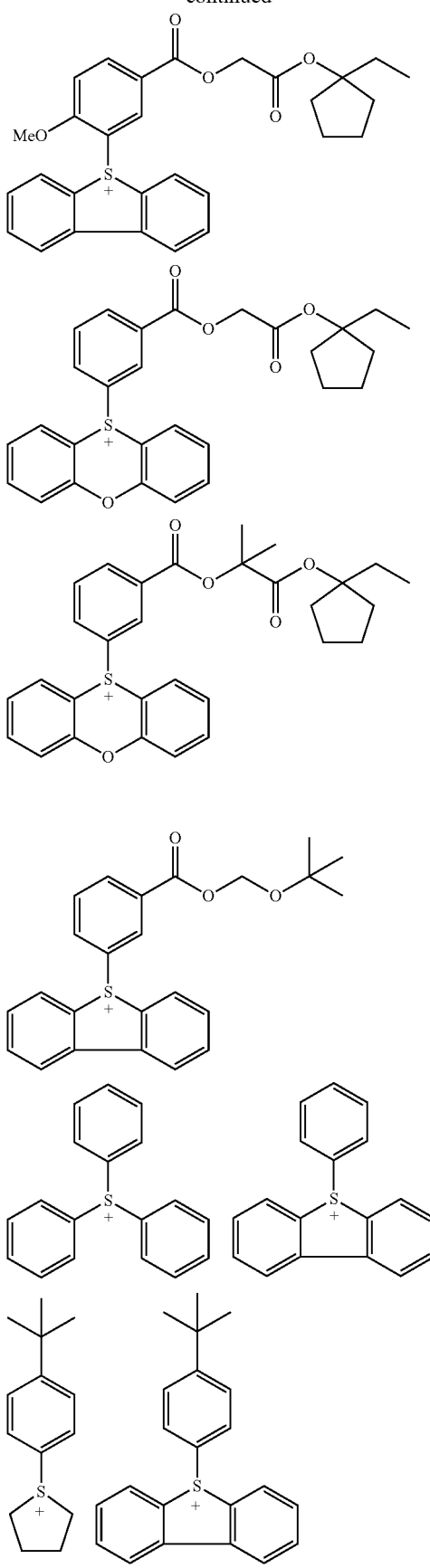

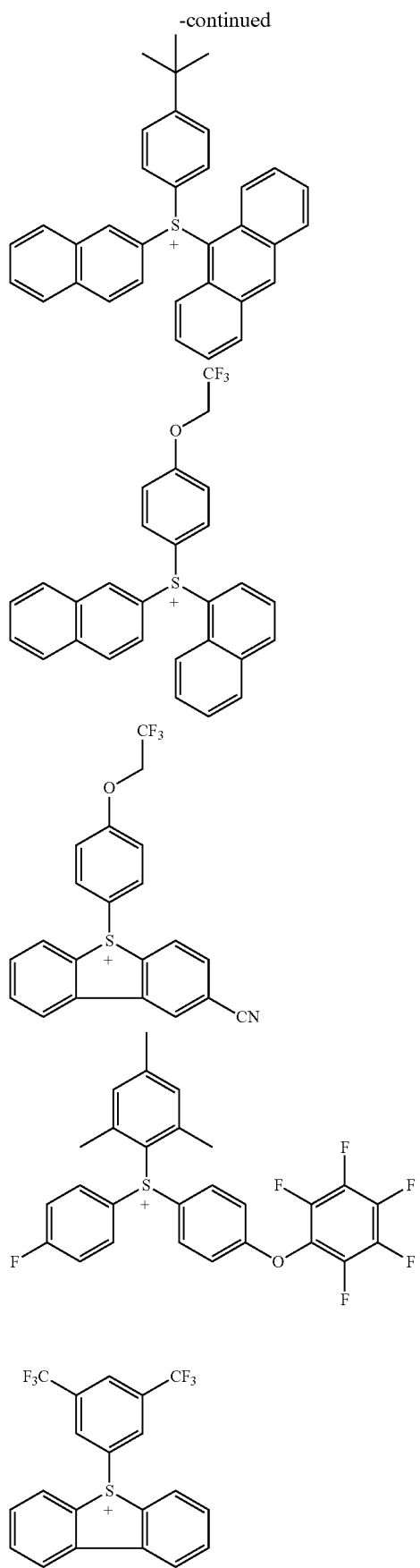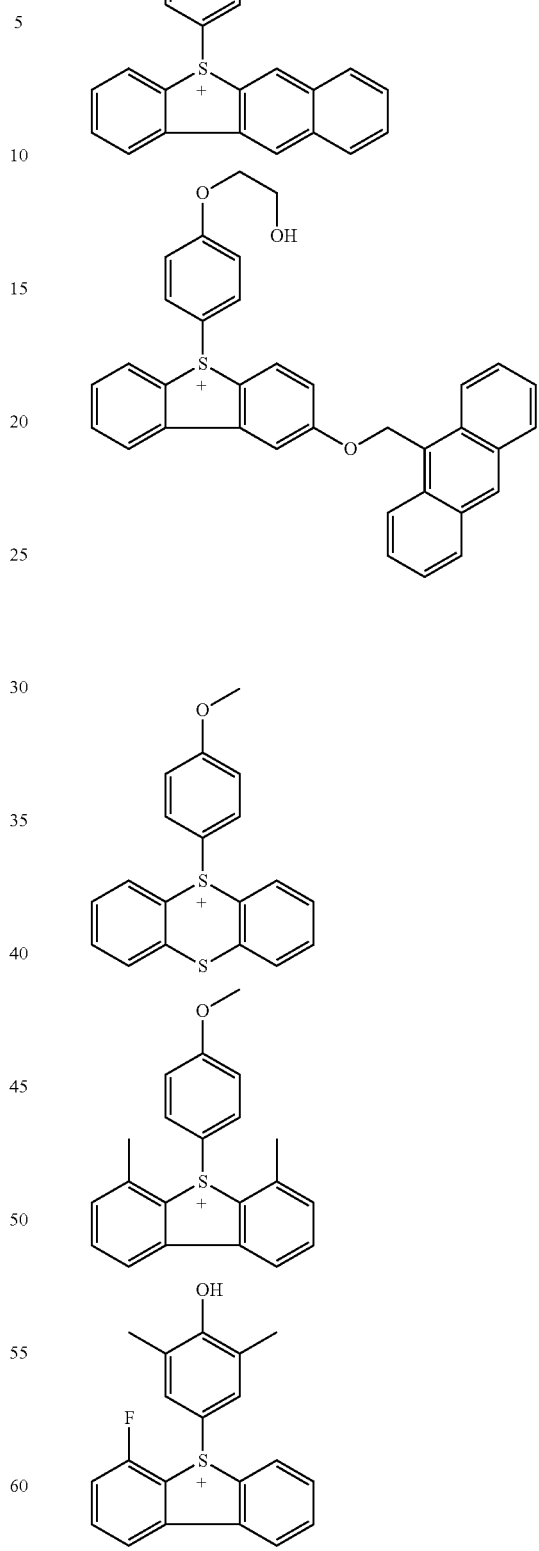
Exemplary specifically preferred anion components of acid generator compounds of the present photoresist compositions include the following:

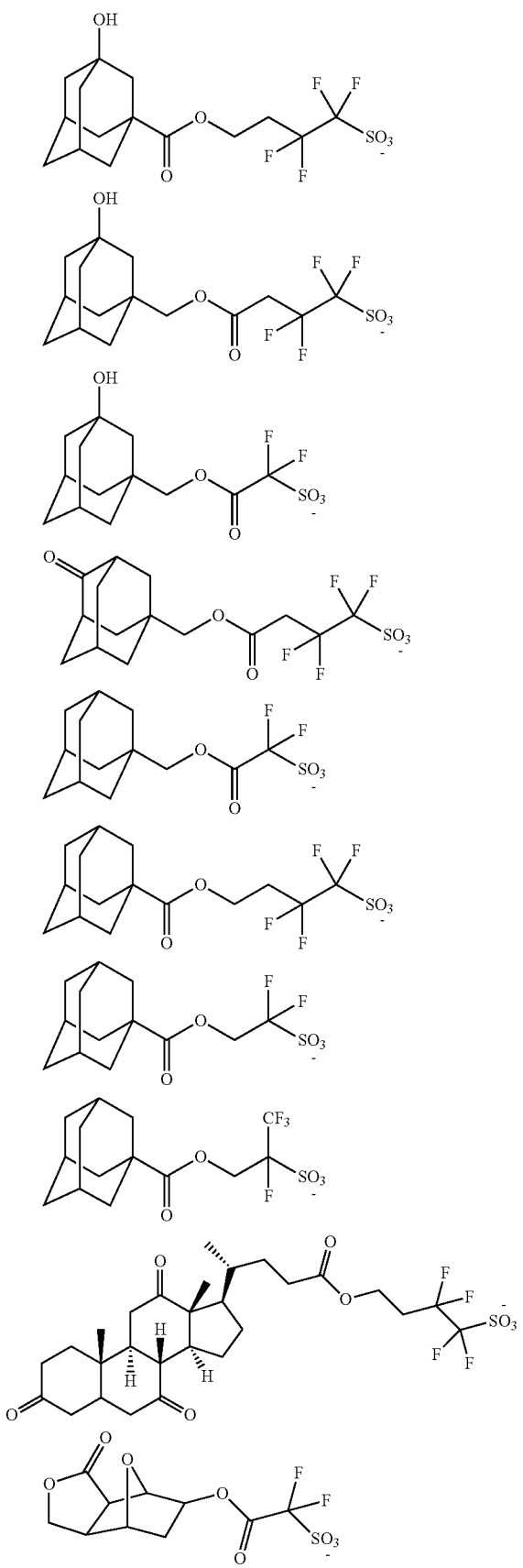

Exemplary preferred acid generator anion components that may be suitably polymerized to provide a first acid generator compound as disclosed herein include the following:

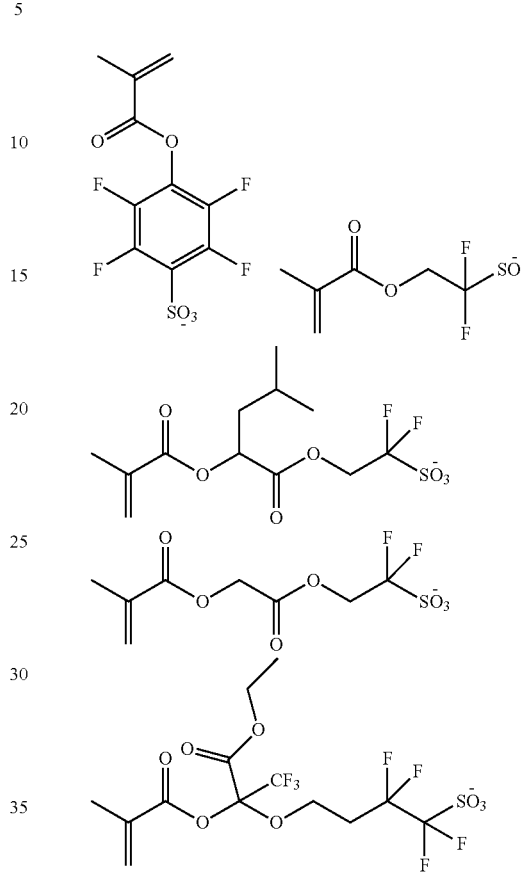

Acid generator compounds of the invention can be readily prepared. Exemplary preferred syntheses are set forth in the examples which follow. Thus, for instance, dibenzothiophene oxide can be functionalized to provide a sulfonium salt, such as by reaction with a substituted phenyl reagent suitably in the presence of Eaton's reagent. The thus formed sulfonium salt can be further functionalized as desired, such as to provide one or more covalently linked acid-labile groups. Polymeric acid generator compounds can be readily prepared e.g. by polymerizing a reactive acid generator compound or a component thereof, such as the above shown acrylate anion components which are coupled with an onium cation component.

As discussed, various moieties of acid generator compounds and other materials may be optionally substituted. A "substituted" substituent may be substituted at one or more available positions, typically 1, 2, or 3 positions by one or more suitable groups such as e.g. halogen (particularly F, Cl or Br); cyano; nitro; $C_{1-8}$ alkyl; $C_{1-8}$ alkoxy; $C_{1-8}$ alkylthio; $C_{1-8}$ alkylsulfonyl; $C_{2-8}$ alkenyl; $C_{2-8}$ alkynyl; hydroxyl; nitro; alkanoyl such as a $C_{1-6}$ alkanoyl e.g. acyl, haloalkyl particularly $C_{1-8}$ haloalkyl such as $CF_3$; —CONHR, —CONRR' where R and R' are optionally substituted $C_{1-8}$ alkyl; —COOH, COC, >C=O; and the like.

Photoresist Compositions

Photoresists of the invention typically comprise a polymer and multiple acid generator compounds as disclosed herein. Preferably the polymer has functional groups that impart alkaline aqueous developability to the resist composition. For example, preferred are polymers that comprise polar functional groups such as hydroxyl or carboxylate, or acid-labile groups that can liberate such polar moieties upon lithographic processing. Preferably the polymer is used in a resist composition in an amount sufficient to render the resist developable with an aqueous alkaline solution.

Photoresists of the invention also may comprise polymers that comprise repeat units containing aromatic groups, such as optionally substituted phenyl including phenol, optionally substituted naphthyl, and optionally substituted anthracene. Optionally substituted phenyl (including phenol) containing polymers are particularly suitable for many resist systems, including those imaged with EUV and e-beam radiation. For positive-acting resists, the polymer also preferably contains one or more repeat units that comprise acid-labile groups. For example, in the case of polymers containing optionally substituted phenyl or other aromatic groups, a polymer may comprise repeat units that contain one or more acid-labile moieties such as a polymer that is formed by polymerization of monomers of an acrylate or methacrylate compound with acid-labile ester (e.g. t-butyl acrylate or t-butyl methacrylate). Such monomers may be copolymerized with one or more other monomers that comprise aromatic group(s) such as optionally phenyl, e.g. a styrene or vinyl phenol monomer.

Preferred monomers used for the formation of such polymers include: an acid-deprotectable monomer having the formula (V), a lactone-containing monomer of the formula (VI), a base-soluble monomer of formula (VII) for adjusting dissolution rate in alkaline developer, and a photoacid-generating monomer of the formula (VIII), or a combination comprising at least one of the foregoing monomers:

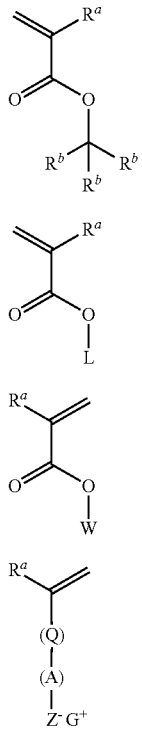

wherein each $R^a$ is independently H, F, —CN, $C_{1-10}$ alkyl, or $C_{1-10}$ fluoroalkyl. In the acid-deprotectable monomer of formula (V), Rb is independently $C_{1-20}$ alkyl, $C_{3-20}$ cycloalkyl, $C_{6-20}$ aryl, or $C_{7-20}$ aralkyl, and each Rb is separate or at least one Rb is bonded to an adjacent Rb to form a cyclic structure. In lactone-containing monomer of formula (VI), L is a monocyclic, polycyclic, or fused polycyclic $C_{4-20}$ lactone-containing group. In the base solubilizing monomer of formula (VII), W is a halogenated or non-halogenated, aromatic or non-aromatic $C_{2-50}$ hydroxyl-containing organic group having a pKa of less than or equal to 12. In the photoacid generating monomer of formula (VIII), Q is ester-containing or non-ester containing and fluorinated or non-fluorinated and is $C_{1-20}$ alkyl, $C_{3-20}$ cycloalkyl, $C_{6-20}$ aryl, or $C_{7-20}$ aralkyl group, A is ester-containing or non-ester-containing and fluorinated or non-fluorinated, and is $C_{1-20}$ alkyl, $C_{3-20}$ cycloalkyl, $C_{6-20}$ aryl, or $C_{7-20}$ aralkyl, $Z^-$ is an anionic moiety comprising carboxylate, sulfonate, an anion of a sulfonamide, or an anion of a sulfonimide, and $G^+$ is a sulfonium or iodonium cation.

Exemplary acid-deprotectable monomers include but are not limited to:

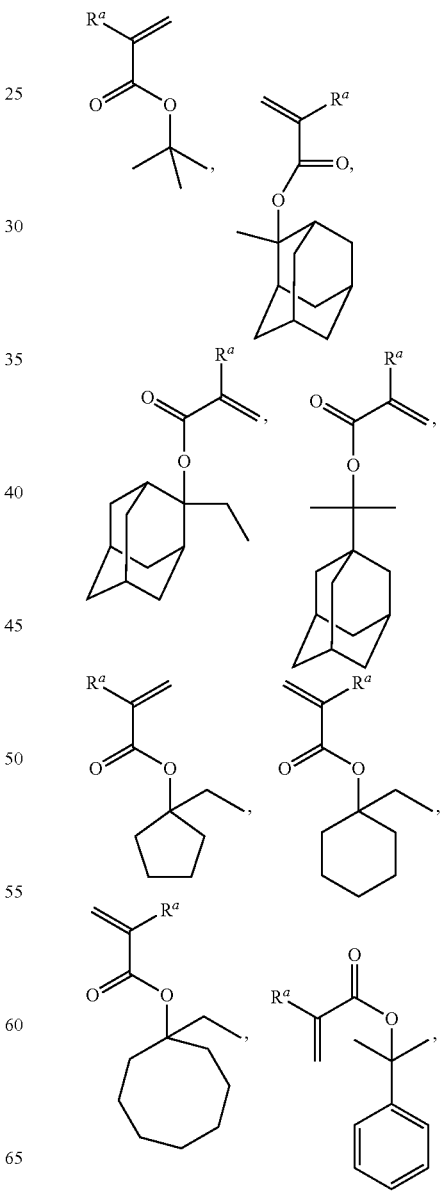

-continued

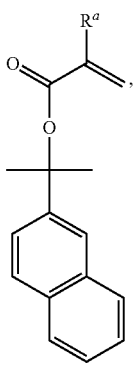

or a combination comprising at least one of the foregoing, wherein $R^a$ is H, F, —CN, $C_{1-6}$ alkyl, or $C_{1-6}$ fluoroalkyl.

Suitable lactone monomers may be of the following formula (IX):

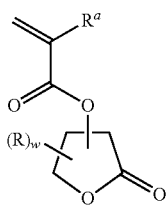
(IX)

wherein $R^a$ is H, F, —CN, $C_{1-6}$ alkyl, or $C_{1-6}$ fluoroalkyl, R is a $C_{1-10}$ alkyl, cycloalkyl, or heterocycloalkyl, and w is an integer of 0 to 5. In formula (IX), R is attached directly to the lactone ring or commonly attached to the lactone ring and/or one or more R groups, and the ester moiety is attached to the lactone ring directly, or indirectly through R.

Exemplary lactone-containing monomers include:

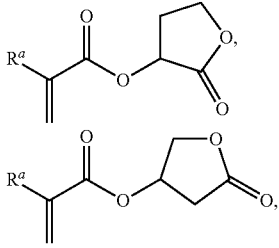

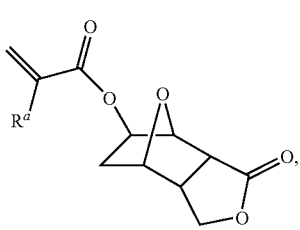

or a combination comprising at least one of the foregoing monomers, wherein $R^a$ is H, F, —CN, $C_{1-10}$ alkyl, or $C_{1-10}$ fluoroalkyl.

Suitable base-soluble monomers may be of the following formula (X):

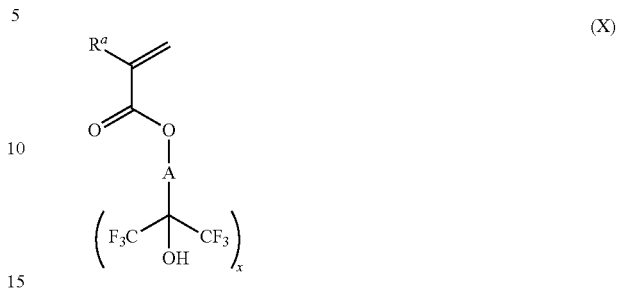
(X)

wherein each $R^a$ is independently H, F, —CN, $C_{1-10}$ alkyl, or $C_{1-10}$ fluoroalkyl, A is a hydroxyl-containing or non-hydroxyl containing, ester-containing or non ester-containing, fluorinated or non-fluorinated $C_{1-20}$ alkylene, $C_{3-20}$ cycloalkylene, $C_{6-20}$ arylene, or $C_{7-20}$ aralkylene, and x is an integer of from 0 to 4, wherein when x is 0, A is a hydroxyl-containing $C_{6-20}$ arylene.

Exemplary base soluble monomers include those having the following structures:

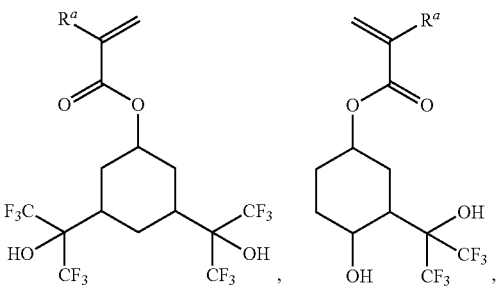

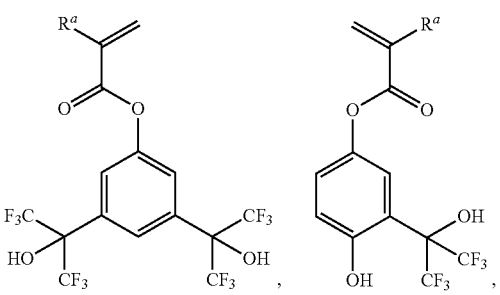

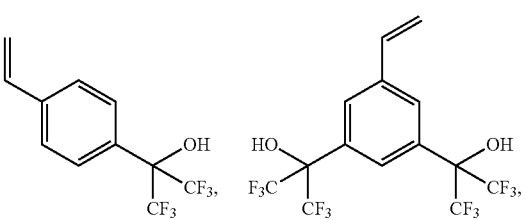

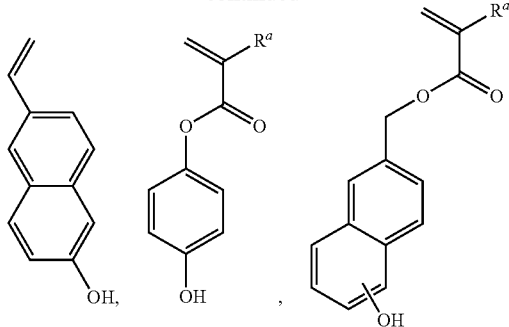

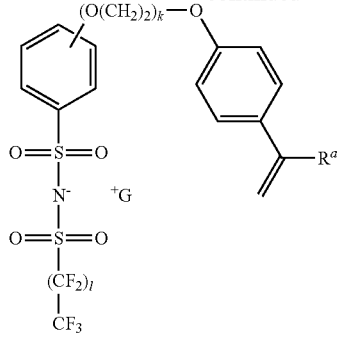

or a combination comprising at least one of the foregoing, wherein $R^a$ is H, F, —CN, $C_{1-6}$ alkyl, or $C_{1-6}$ fluoroalkyl.

Preferred photoacid generating monomer include those of the formulae (XI) or (XII):

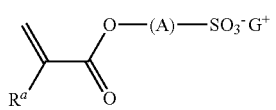
(XI)

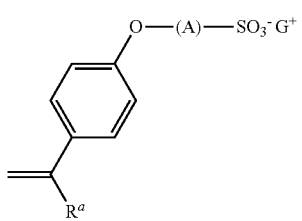
(XII)

wherein each $R^a$ is independently H, F, —CN, $C_{1-6}$ alkyl, or $C_{1-6}$ fluoroalkyl, A is a fluorine-substituted $C_{1-30}$ alkylene group, a fluorine-substituted $C_{3-30}$ cycloalkylene group, a fluorine-substituted $C_{6-30}$ arylene group, or a fluorine-substituted $C_{7-30}$ alkylene-arylene group, and $G^+$ is a sulfonium or iodonium cation.

Preferably, in formulas (XI) and (XII), A is a —[(C(R$^1$)$_2$)$_x$C(=O)O]$_b$—C((R$^2$)$_2$)$_y$(CF$_2$)$_z$— group, or an o-, m- or p-substituted —C$_6$F$_4$— group, where each $R^1$ and $R^2$ are each independently H, F, —CN, $C_{1-6}$ fluoroalkyl, or $C_{1-6}$ alkyl, b is 0 or 1, x is an integer of 1 to 10, y and z are independently integers of from 0 to 10, and the sum of y+z is at least 1.

Exemplary preferred photoacid generating monomers include:

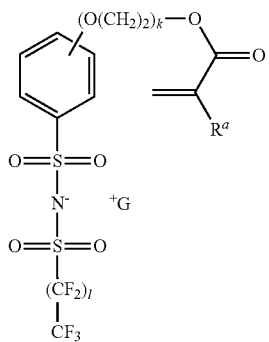

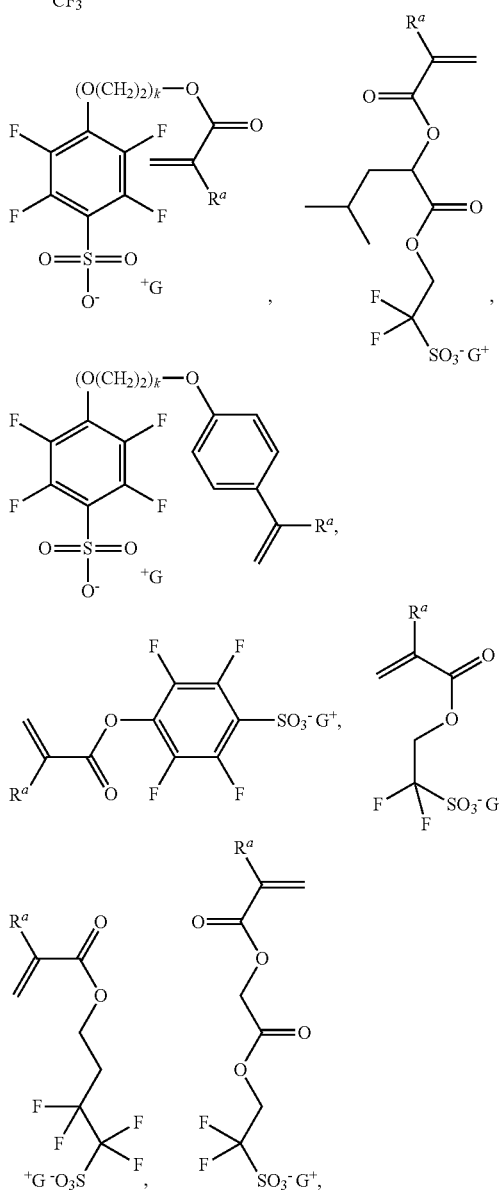

or a combination comprising at least one of the foregoing, where each $R^a$ is independently H, F, —CN, $C_{1-6}$ alkyl, or $C_{1-6}$ fluoroalkyl, k is suitably an integer of from 0 to 5; and $G^+$ is a sulfonium or iodonium cation.

Preferred photoacid-generating monomers may include sulfonium or iodonium cation. Preferably, in formula (IV), $G^+$ is of the formula (XIII):

(XIII)

wherein X is S or I, each $R^0$ is halogenated or non-halogenated and is independently $C_{1-30}$ alkyl group; a polycyclic or monocyclic $C_{3-30}$ cycloalkyl group; a polycyclic or monocyclic $C_{4-30}$ aryl group; or a combination comprising at least one of the foregoing, wherein when X is S, one of the $R^0$ groups is optionally attached to one adjacent $R^0$ group by a single bond, and a is 2 or 3, wherein when X is I, a is 2, or when X is S, a is 3.

Exemplary acid generating monomers include those having the formulas:

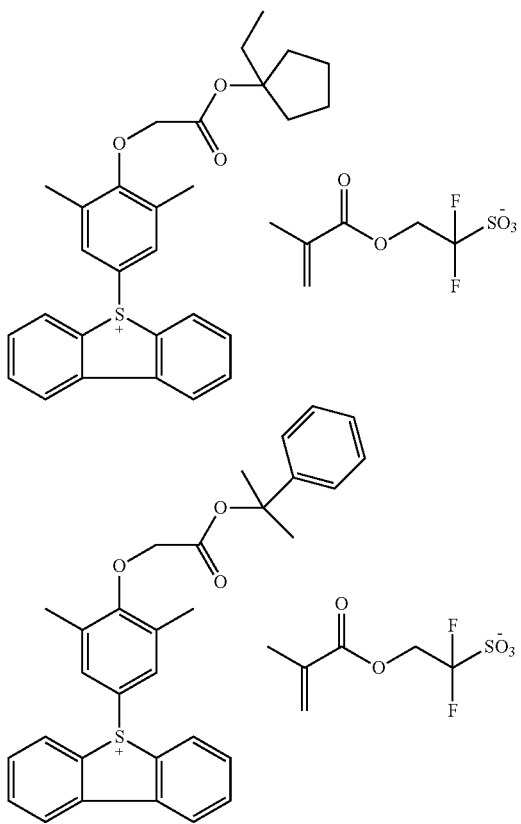

wherein $R^a$ is H, F, —CN, $C_{1-6}$ alkyl, or $C_{1-6}$ fluoroalkyl.

Specifically suitable polymers that have acid-labile deblocking groups for use in a positive-acting chemically-amplified photoresist of the invention have been disclosed in European Patent Application 0829766A2 (polymers with acetal and ketal polymers) and European Patent Application EP0783136A2 (terpolymers and other copolymers including units of 1) styrene; 2) hydroxystyrene; and 3) acid labile groups, particularly alkyl acrylate acid labile groups.

Polymers for use in photoresists of the invention may suitably vary widely in molecular weight and polydisperity. Suitable polymers include those that have a $M_w$ of from about 1,000 to about 50,000, more typically about 2,000 to about 30,000 with a molecular weight distribution of about 3 or less, more typically a molecular weight distribution of about 2 or less.

Preferred negative-acting compositions of the invention comprise a mixture of materials that will cure, crosslink or harden upon exposure to acid, and a photoactive component of the invention. Preferred negative acting compositions comprise a polymer binder such as a phenolic or non-aromatic polymer, a crosslinker component and a photoactive component of the invention. Such compositions and the use thereof have been disclosed in European Patent Applications 0164248 and U.S. Pat. No. 5,128,232 to Thackeray et al. Preferred phenolic polymers for use as the polymer binder component include novolaks and poly(vinylphenol)s such as those discussed above. Preferred crosslinkers include amine-based materials, including melamine, glycolurils, benzoguanamine-based materials and urea-based materials. Melamine-formaldehyde polymers are often particularly suitable. Such crosslinkers are commercially available, e.g. the melamine polymers, glycoluril polymers, urea-based polymer and benzoguanamine polymers, such as those sold by Cytec under tradenames Cymel 301, 303, 1170, 1171, 1172, 1123 and 1125 and Beetle 60, 65 and 80.

Photoresists of the invention also may contain other materials. For example, other optional additives include actinic and contrast dyes, anti-striation agents, plasticizers, speed enhancers, sensitizers, photodestroyable bases etc. Such optional additives typically will be present in minor concentration in a photoresist composition.

Inclusion of base materials, preferably the carboxylate or sulfonate salts of photo-decomposable cations, provides a mechanism for neutralization of acid from the acid decomposable groups, and limits the diffusion of the photogenerated acid, to thereby provide improved contrast in the photoresist.

Photo-destroyable bases include photo-decomposable cations, and preferably those also useful for preparing acid generator compounds, paired with an anion of a weak (pKa >2) acid such as, for example, a $C_{1-20}$ carboxylic acid. Exemplary such carboxylic acids include formic acid, acetic acid, propionic acid, tartaric acid, succinic acid, cyclohexylcarboxylic acid, benzoic acid, salicylic acid, and other such carboxylic acids.

Alternatively, or in addition, other additives may include quenchers that are non-photo-destroyable bases, such as, for example, those based on hydroxides, carboxylates, amines, imines, and amides. Preferably, such quenchers include $C_{1-30}$ organic amines, imines, or amides, or may be a $C_{1-30}$ quaternary ammonium salt of a strong base (e.g., a hydroxide or alkoxide) or a weak base (e.g., a carboxylate). Exemplary quenchers include amines such as tripropylamine, dodecylamine, 1,1',1''-nitrilotripropan-2-ol, 1,1',1'',1'''-(ethane-1,2-diylbis(azanetriyl))tetrapropan-2-ol; aryl amines such as diphenylamine, triphenylamine, aminophenol, and 2-(4-aminophenyl)-2-(4-hydroxyphenyl)propane, Troger's base, a hindered amine such as diazabicycloundecene (DBU) or diazabicyclononene (DBN), or ionic quenchers including quaternary alkyl ammonium salts such as tetrabutylammonium hydroxide (TBAH) or tetrabutylammonium lactate.

Surfactants include fluorinated and non-fluorinated surfactants, and are preferably non-ionic. Exemplary fluorinated non-ionic surfactants include perfluoro $C_4$ surfactants such as FC-4430 and FC-4432 surfactants, available from 3M Corporation; and fluorodiols such as POLYFOX PF-636, PF-6320, PF-656, and PF-6520 fluorosurfactants from Omnova.

A photoresist suitably further includes a solvent generally suitable for dissolving, dispensing, and coating the components used in a photoresist. Exemplary solvents include anisole, alcohols including ethyl lactate, 1-methoxy-2-propanol, and 1-ethoxy-2 propanol, esters including n-butylacetate, 1-methoxy-2-propyl acetate, methoxyethoxypropionate, ethoxyethoxypropionate, ketones including cyclohexanone and 2-heptanone, and a combination comprising at least one of the foregoing solvents.

Such photoresists may include the copolymer in an amount of 50 to 99 wt %, specifically 55 to 95 wt %, more specifically 60 to 90 wt %, and still more specifically 65 to 90 based on the total weight of solids. The photo-destroyable base may be present in the photoresist in an amount of 0.01 to 5 wt %, specifically 0.1 to 4 wt %, and still more specifically 0.2 to 3 wt %, based on the total weight of solids. A surfactant may be included in an amount of 0.01 to 5 wt %, specifically 0.1 to 4 wt %, and still more specifically 0.2 to 3 wt %, based on the total weight of solids. A quencher may be included in relatively small amounts of for example, from 0.03 to 5 wt % based on the total weight of solids. Other additives may be included in amounts of less than or equal to 30 wt %, specifically less than or equal to 20%, or more specifically less than or equal to 10%, based on the total weight of solids. The total solids content for the photoresist composition may be 0.5 to 50 wt %, specifically 1 to 45 wt %, more specifically 2 to 40 wt %, and still more specifically 5 to 30 wt %, based on the total weight of solids and solvent.

The acid generator compounds should be present in an amount sufficient to enable generation of a latent image in a coating layer of the resist. More specifically, the acid generator compounds will typically be present in an amount of from about 1 to 60 weight percent of total solids of a resist. The content of a polymeric acid generator and a non-polymeric acid generator in a photoresist composition can suitably vary widely, typically with at least about 2 or 5 weight percent of the total acid generator component content of a photoresist being either a polymeric acid generator or non-polymeric acid generator, more suitably at least 5, 10, 15, 20, 25, 30, 35, 40, 45, 50, 55 or 60 weight percent of the total acid generator component content of a photoresist being either a polymeric acid generator or non-polymeric acid generator.

As discussed above, in preferred aspects, use of a high relative weight amount of the non-polymeric acid generator can provide enhanced lithographic results, including good line edge roughness and contrast of a formed resist relief image. In such aspects, the non-polymeric acid generator may be suitably present in an amount of at least about 1, 5, 10, 20, 30, 40, 50 or 60 weight percent relative to all polymers having a bonded acid generator. Preferably, all non-polymeric acid generator components are present in an amount of from 5 to 60 weight percent, more preferably from 10 to 50 weight percent, and most preferably from about 15 to 40 weight percent, relative to all polymers having a bonded acid generator.

It will be understood that the solids of a photoresist as referred to herein includes copolymer, photo-destroyable base, quencher, surfactant, any added PAG, and any optional additives, exclusive of solvent.

A coated substrate may be formed from the photoresist containing acid generator compounds which should be present in an amount sufficient to enable generation of a latent image in a coating layer of the resist and acid generator compound. Such a coated substrate includes: (a) a substrate having one or more layers to be patterned on a surface thereof; and (b) a layer of the photoresist composition including the acid generator compound over the one or more layers to be patterned. For EUV or e beam imaging, photoresists may suitably have relatively higher content of acid generator compounds, e.g. where the two or more acid generator compounds comprise 5 to 10 to about 65 weight percent of total solids of the resist. Typically, lesser amounts of the photoactive component will be suitable for chemically amplified resists.

The photoresists of the invention are generally prepared following known procedures with the exception that one or more acid generator compounds of the invention are substituted for prior photoactive compounds used in the formulation of such photoresists. The photoresists of the invention can be used in accordance with known procedures.

Substrates may be any dimension and shape, and are preferably those useful for photolithography, such as silicon, silicon dioxide, silicon-on-insulator (SOI), strained silicon, gallium arsenide, coated substrates including those coated with silicon nitride, silicon oxynitride, titanium nitride, tantalum nitride, ultrathin gate oxides such as hafnium oxide, metal or metal coated substrates including those coated with titanium, tantalum, copper, aluminum, tungsten, alloys thereof, and combinations thereof. Preferably, the surfaces of substrates herein include critical dimension layers to be patterned including, for example, one or more gate-level layers or other critical dimension layer on the substrates for semiconductor manufacture. Such substrates may preferably include silicon, SOI, strained silicon, and other such substrate materials, formed as circular wafers having dimensions such as, for example, 20 cm, 30 cm, or larger in diameter, or other dimensions useful for wafer fabrication production.

Further, a method of forming an electronic device includes (a) applying a layer of a photoresist composition including on a surface of the substrate; (b) patternwise exposing the photoresist composition layer to activating radiation; and (c) developing the exposed photoresist composition layer to provide a resist relief image.

Applying may be accomplished by any suitable method, including spin coating, spray coating, dip coating, doctor blading, or the like. Applying the layer of photoresist is preferably accomplished by spin-coating the photoresist in solvent using a coating track, in which the photoresist is dispensed on a spinning wafer. During dispense, the wafer may be spun at a speed of up to 4,000 rpm, preferably from about 500 to 3,000 rpm, and more preferably 1,000 to 2,500 rpm. The coated wafer is spun to remove solvent, and baked on a hot plate to remove residual solvent and free volume from the film to make it uniformly dense.

Patternwise exposure is then carried out using an exposure tool such as a stepper, in which the film is irradiated through a pattern mask and thereby is exposed pattern-wise. The method preferably uses advanced exposure tools generating activating radiation at wavelengths capable of high resolution including extreme-ultraviolet (EUV) or e-beam radiation. It will be appreciated that exposure using the activating radiation decomposes the PAG in the exposed areas and generates acid and decomposition by-products, and that the acid then effects a chemical change in the polymer (deblocking the acid sensitive group to generate a base-soluble group, or alternatively, catalyzing a cross-linking reaction in the exposed areas). The resolution of such exposure tools may be less than 30 nm.

Developing the exposed photoresist layer is then accomplished by treating the exposed layer to a suitable developer capable of selectively removing the exposed portions of the film (where the photoresist is positive tone) or removing the unexposed portions of the film (where the photoresist is crosslinkable in the exposed regions, i.e., negative tone). Preferably, the photoresist is positive tone based on a polymer having acid sensitive (deprotectable) groups, and the developer is preferably a metal-ion free tetraalkylammonium hydroxide solution, such as, for example, aqueous 0.26 N tetramethylammonium hydroxide. A pattern forms by developing.

Additionally, for positive resists, unexposed regions can be selectively removed by treatment with a suitable nonpolar solvent for negative tone development. See U.S. 2011/0294069 for suitable procedures for negative tone development of positive photoresists. Typical nonpolar solvents for negative tone development are organic developers, such as a solvent chosen from ketones, esters, hydrocarbons, and mixtures thereof, e.g. acetone, 2-hexanone, methyl acetate, butyl acetate, and terahydrofuran.

The photoresist may, when used in one or more such a pattern-forming processes, be used to fabricate electronic and optoelectronic devices such as memory devices, processor chips (CPU's), graphics chips, and other such devices.

EXAMPLES 1-18

Syntheses of Acid Generator Compounds

Example 1

Synthesis of 5-phenyl-5H-dibenzo[b,d]thiophenium 3-hydroxyadamantane-acetoxy-1,1,2,2-tetrafluorobutane-1-sulfonate

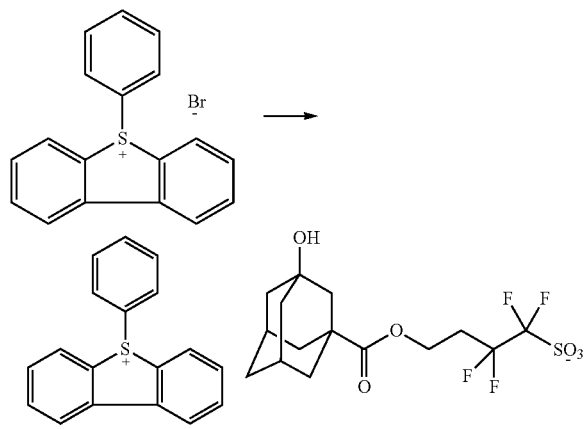

5-phenyl-5H-dibenzo[b,d]thiophenium bromide (28.0 g, 82.04 mmol) and 3-hydroxyadamantane-acetoxy-1,1,2,2-tetrafluorobutane-1-sulfonate-sodium salt (35.68 g, 83.7 mmol) were dissolved in dichloromethane (500 mL) and water (500 mL) and stirred at r.t. for 16 h. The dichloromethane layer was separated and the aqueous phase washed with dichloromethane (3×300 mL). The combined organic layers were washed with water (4×500 mL), concentrated in vacuo and residual water removed via azeotrope with acetonitrile (2×350 mL) to afford the title compound (54.00 g, 99%) as a white solid. $^1$H NMR (500 MHz, (CD$_3$)$_2$CO) δ: 8.55 (d, J=8 Hz, 2H), 8.41 (d, J=8 Hz, 2H), 8.02 (dt, J=7.5, 0.5 Hz, 2H), 7.77-7.84 (m, 5H), 7.67 (t, J=7.5 Hz, 2H), 4.31 (t, J=6.5 Hz, 2H), 3.63 (s, 10H), 2.71 (tt, J=14, 6.5 Hz, 2H), 1.52-1.80 (m, 12H).

Example 2

Synthesis of 5-phenyl-5H-dibenzo[b,d]thiophenium 1,1-difluoro-2-(methacryloyloxy)ethanesulfonate

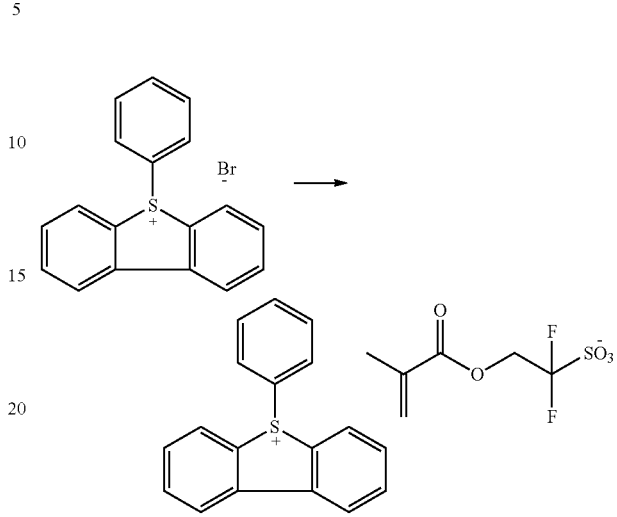

5-phenyl-5H-dibenzo[b,d]thiophenium bromide (80.0 g, 234 mmol) and triethylammonium 1,1-difluoro-2-(methacryloyloxy)ethanesulfonate (78.5 g, 238 mmol) were dissolved in H$_2$O (750 mL) and dichloromethane (750 mL) and stirred at r.t. for 18 h. The dichloromethane layer was separated and the aqueous phase washed with dichloromethane (3×500 mL). The combined organic layers were washed with water (3×1 L) and concentrated in vacuo to afford the title compound (109 g, 95%) as a white solid. $^1$H NMR (500 MHz, (CD$_3$)$_2$CO) δ: 8.56 (dd, J=7.5, 1 Hz, 2H), 8.42 (d, J=8 Hz, 2H), 8.05 (dt, J=8 Hz, 1 Hz, 2H), 7.77-7.87 (m, 5H), 7.69 (dt, J=8, 1 Hz, 2H), 6.14-6.16 (m, 1H), 5.66-5.69 (m, 1H), 4.75 (dd, J=15, 15 Hz, 2H), 1.93-1.94 (m, 3H).

Example 3

Synthesis of 1-ethylcyclopentyl 2-bromoacetate

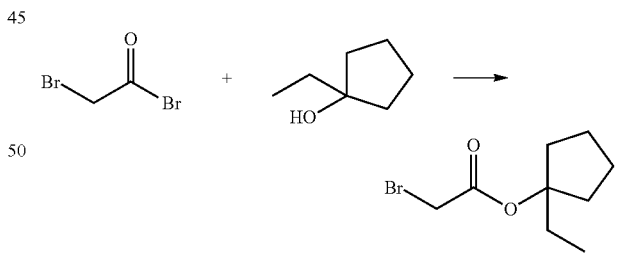

Pyridine (67.5 g, 0.854 mol) was added dropwise to a solution of ethylcyclopropanol (75.0 g, 675 mmol) in anhydrous dichloromethane (750 mL) under N$_2$ at 0° C. and stirred for 5 minutes. Bromoacetyl bromide (172 g, 74.4 mL, 854 mmol) in dichloromethane (75 mL) was added dropwise and the solution stirred at 0° C. for 20 h. The pyridinium bromide was filtered off, washed with dichloromethane (2×300 mL) and the solid pyridinium bromide discarded. The combined organic layers were washed with water (4×750 mL), and concentrated in vacuo. The crude oil was purified via of silica gel flash column chromatography (neutralized with TEA, 1:0 to 99:1 heptane:ethyl acetate).

After concentration, the oil was filtered to afford the title compound (130 g, 84%) as a light orange oil. NMR (500 MHz, (CD$_3$)$_2$SO) δ: 3.93 (s, 2H), 2.07-2.14 (m, 2H), 2.00 (q, J=7 Hz, 2H), 1.59-1.77 (m, 4H), 0.89 (t, J=7 Hz, 3H).

Example 4

Synthesis of 5-(4-hydroxy-3,5-dimethylphenyl)-5H-dibenzo[b,d]thiophenium bromide

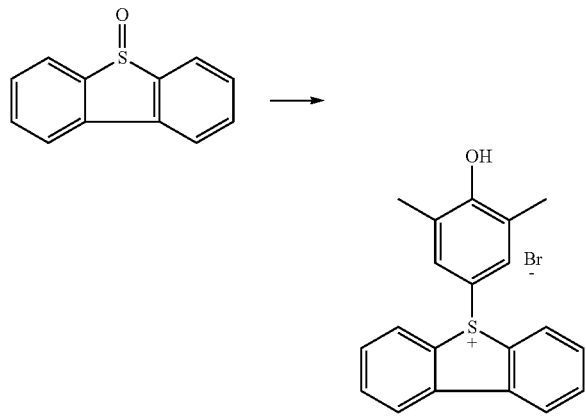

Eaton's Reagent (100 mL) was added dropwise to a solution of dibenzothiophene oxide (15.0 g, 74.9 mmol) and 2,6-dimethylphenol (9.15 g, 74.9 mmol) in dichloromethane (200 mL) at 0° C. The reaction was warmed to r.t. and stirred for 4 h, then cooled to 0° C. and quenched with the slow addition of water (200 mL) keeping the reaction temperature below 20° C. The aqueous phase was extracted with ethyl acetate (3×100 mL) and potassium bromide (17.9 g, 0.150 mmol) in water (50 mL) was added to the aqueous layer under vigorous stirring. The slurry was stirred at r.t. for 1 h, filtered and washed with water (3×200 mL), MTBE (3×200 mL) and the residue dried in vacuo to afford the title compound (10.1 g, 35%) as an off-white solid. $^1$H NMR (300 MHz, (CD$_3$)$_2$CO) δ: 9.77 (brs, 10H), 8.52 (d, J=8.1 Hz, 2H), 8.27 (8.1 Hz, 2H), 7.95 (t, J=7.8 Hz, 2H), 7.74 (t, J=7.8 Hz, 2H), 7.20 (s, 2H), 2.12 (s, 6H).

Example 5

Synthesis of 5-(4-(2-(1-ethylcyclopentyloxy)-2-oxo-ethoxy)-3,5-dimethylphenyl)-5H-dibenzo[b,d]thio-phenium bromide

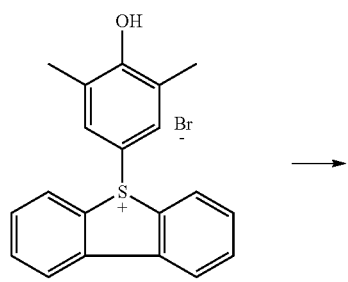

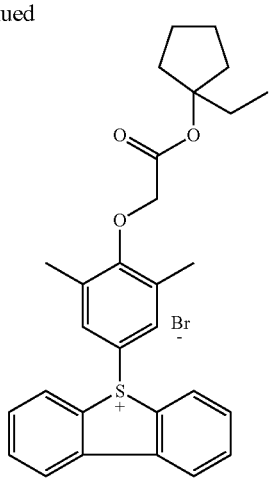

1-ethylcyclopentyl 2-bromoacetate (4.03 g, 17.1 mmol, 1.1 eq) was added dropwise to a solution of 5-(4-hydroxy-3,5-dimethylphenyl)-5H-dibenzo[b,d]thiophenium bromide (6.00 g, 15.6 mmol) and cesium carbonate (10.15 g, 31.1 mmol, 2 eq) in dimethylformamide (150 mL) under N$_2$ at 0° C. The solution was slowly warmed to r.t. and stirred for 16 h. The reaction mixture was diluted with water (400 mL) and dichloromethane (400 mL). The organic layer was separated and the aqueous layer extracted with dichloromethane (4×150 mL). The combined organic layers were extracted with water (2×300 mL), dried (Na$_2$SO$_4$) and concentrated to the remaining DMF (~100 mL). This non-viscous solution was slowly poured onto MTBE (700 mL) under vigorous stirring. The precipitate was filtered, washed with MTBE (3×200 mL) and the residue dried in vacuo to afford the title compound (7.92 g, 94%) as a white solid. $^1$H NMR (500 MHz, d-DMSO) δ: 8.51 (d, J=8 Hz, 2H), 8.32 (d, J=7.5 Hz, 2H), 7.96 (t, J=7.5 Hz, 2H), 7.75 (t, J=7.5 Hz, 2H), 7.31 (s, 2H), 4.51 (s, 2H), 2.21 (s, 6H), 1.93-2.03 (m, 2H), 1.92 (q, J=7 Hz, 2H), 1.49-1.69 (m, 6H), 0.79 (t, J=7 Hz, 3H).

Example 6

Synthesis of 5-(4-(2-(1-ethylcyclopentyloxy)-2-oxo-ethoxy)-3,5-dimethylphenyl)-5H-dibenzo[b,d]thio-phenium 3-hydroxyadamantane-acetoxy-1,1,2,2-tetrafluorobutane-1-sulfonate

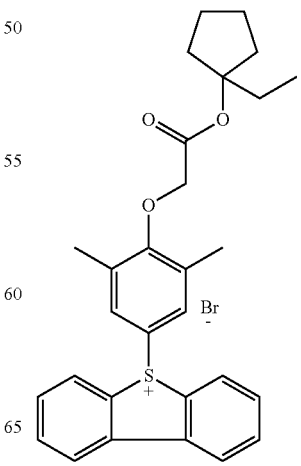

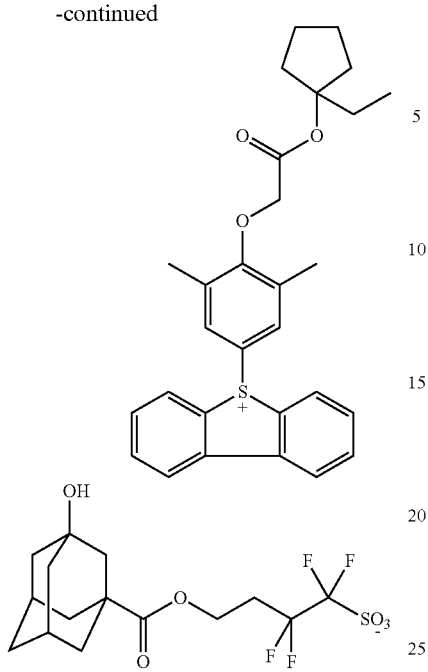

5-(4-(2-(1-ethylcyclopentyloxy)-2-oxoethoxy)-3,5-dimethylphenyl)-5H-dibenzo[b,d]thiophenium bromide (2.00 g, 3.71 mmol) and sodium 3-hydroxyadamantane-acetoxy-1,1,2,2-tetrafluorobutane-1-sulfonate (1.61 g, 3.78 mmol) were dissolved in dichloromethane (100 mL) and water (100 mL) and stirred at r.t. overnight. The dichloromethane layer was separated and the aqueous phase washed with dichloromethane (3×100 mL). The combined organic layers were washed with water (4×200 mL), concentrated in vacuo and residual water removed via azeotrope with acetonitrile (2×200 mL) to afford the title compound (2.90 g, 91%) as a white solid. $^1$H NMR (500 MHz, (CD$_3$)$_2$CO) δ: 8.52 (d, J=8 Hz, 2H), 8.34 (d, J=8.5 Hz, 2H), 8.01 (t, J=7.5 Hz, 2H), 7.08 (t, J=7.5 Hz, 2H), 7.51 (s, 2H), 4.55 (s, 2H), 4.32 (t, J=6.5 Hz, 2H), 3.60 (brs, OH), 2.72 (tt, J=14, 6.5 Hz, 2H), 2.29 (s, 6H), 2.12-2.20 (m, 2H), 2.00 (q, J=7 Hz, 2H), 1.50-1.82 (m, 12H), 0.84 (t, J=7 Hz, 3H).

Example 7

Synthesis of 5-(4-(2-(1-ethylcyclopentyloxy)-2-oxoethoxy)-3,5-dimethylphenyl)-5H-dibenzo[b,d]thiophenium 4-((4R)-4-((8R,9S,10S,13R,14S,17R)-10,13-dimethyl-3,7,12-trioxohexadecahydro-1H-cyclopenta[a]phenanthren-17-yl)pentanoyloxy)-1,1,2,2-tetrafluorobutane-1-sulfonate

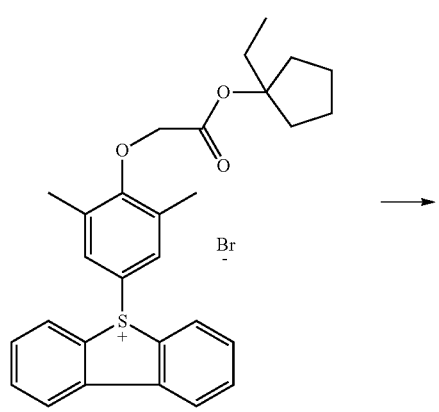

→

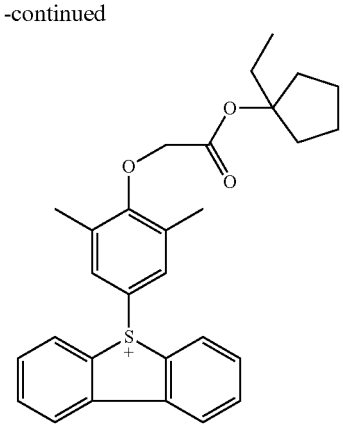

5-(4-(2-(1-ethylcyclopentyloxy)-2-oxoethoxy)-3,5-dimethylphenyl)-5H-dibenzo[b,d]thiophenium bromide (4.20 g, 7.79 mmol) and sodium 4-((4R)-4-((8R,9S,10S,13R,14S,17R)-10,13-dimethyl-3,7,12-trioxohexadecahydro-1H-cyclopenta[a]phenanthren-17-yl)pentanoyloxy)-1,1,2,2-tetrafluorobutane-1-sulfonate (4.78 g, 7.56 mmol) were dissolved in dichloromethane (225 mL) and water (225 mL) and stirred at room temperature overnight. The dichloromethane layer was separated and the aqueous phase washed with dichloromethane (3×250 mL). The combined organic layers were washed with water (4×250 mL), concentrated in vacuo and residual water removed via azeotrope with acetonitrile (2×250 mL) to afford the title compound (6.48 g, 80%) as a white solid. $^1$H NMR (500 MHz, (CD$_3$)$_2$CO) δ: 8.53 (d, J=8 Hz, 2H), 8.37 (d, J=8 Hz, 2H), 8.04 (t, J=7.5 Hz, 2H), 7.85 (t, J=7.5 Hz, 2H), 7.52 (s, 2H), 4.57 (s, 2H), 4.32 (t, J=7 Hz, 2H), 3.06-3.17 (m, 3H), 2.95 (t, J=12.5 Hz, 1H), 2.66-2.83 (m, 3H), 2.2-2.54 (m, 8H), 1.57-2.14 (m, 13H), 1.48 (s, 3H), 1.25-1.41 (m, 7H), 1.90-1.12 (m, 6H), 0.82-0.89 (m, 9H).

Example 8

Synthesis of 5-(4-(2-(1-ethylcyclopentyloxy)-2-oxo-ethoxy)-3,5-dimethylphenyl)-5H-dibenzo[b,d]thiophenium 1,1-difluoro-2-(methacryloyloxy)ethanesulfonate

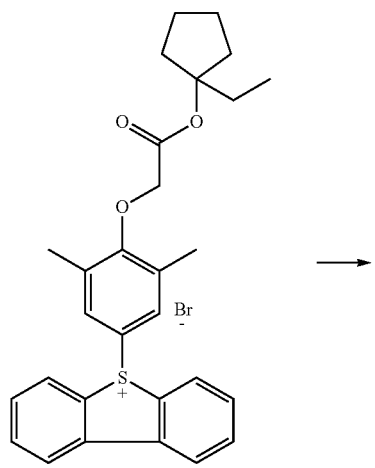

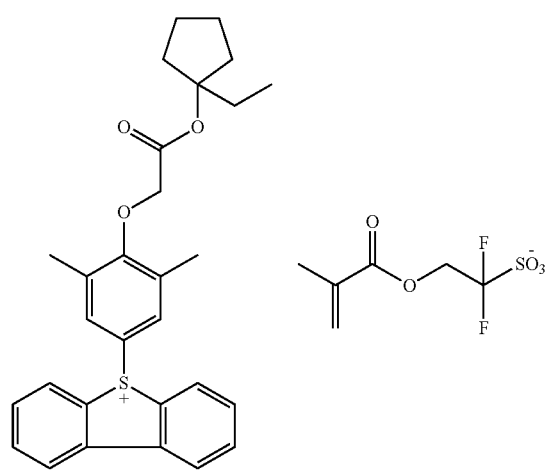

5-(4-(2-(1-ethylcyclopentyloxy)-2-oxoethoxy)-3,5-dimethylphenyl)-5H-dibenzo[b,d]thiophenium bromide (20.0 g, 37.1 mmol) and triethylammonium 1,1-difluoro-2-(methacryloyloxy)ethanesulfonate (1.1 eq, 40.8 mmol, 13.5 g) were dissolved in dichloromethane (250 mL) and water (250 mL) and stirred at r.t. overnight. The dichloromethane layer was separated and the aqueous phase washed with dichloromethane (3×250 mL). The combined organic layers were washed with water (4×250 mL), concentrated in vacuo and residual water removed via azeotrope with acetonitrile (2×250 mL) to afford the title compound (23.8 g, 93%) as a white solid. $^1$H NMR (300 MHz, (CD$_3$)$_2$CO) δ: 8.53 (d, J=7.8 Hz, 2H), 8.36 (d, J=7.8 Hz, 2H), 8.04 (t, J=7.5 Hz, 2H), 7.83 (t, J=7.8 Hz, 2H), 7.51 (visual s, 2H), 6.14-6.16 (m, 2H), 5.66-5.69 (m, 2H), 4.75 (dd, J=15.6, 15.6 Hz, 2H), 4.57 (s, 2H), 2.30 (s, 6H), 2.03-2.11 (m, 2H), 2.02 (q, J=7.8 Hz, 2H), 1.93-1.95 (m, 3H), 1.55-1.6 (m, 6H), 0.84 (t, J=7.5 Hz, 3H).

Example 9

Synthesis of 5-(5-carboxy-2-methoxyphenyl)-5H-dibenzo[b,d]thiophenium iodide

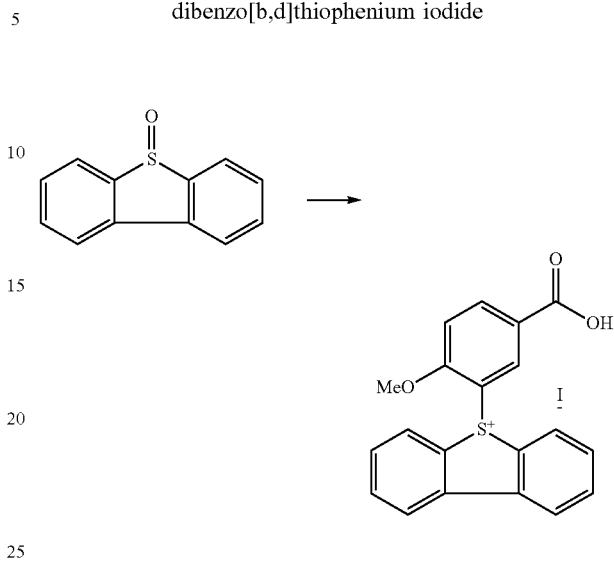

Dibenzothiophene oxide (57 g, 285 mmol) and 4-methoxybenzoic acid (47.7 g, 314 mmol, 1.1 eq) were suspended in dichloromethane (400 mL) and cooled to 0° C. where Eaton's Reagent (285 mL) was added dropwise. The solution was taken off ice and stirred overnight at r.t. The reaction mixture was cooled back to 0° C. and quenched with the slow addition of water (800 mL), followed by ethyl acetate (500 mL). The precipitate was filtered off and the layers separated. The aqueous layer was extracted with ethyl acetate (2×500 mL) and the combined organic layers were washed with water (500 mL). Sodium iodide (341.6 g, 2.28 mol, 4 eq) in water (500 mL) was slowly poured onto the combined aqueous layers. Additional water was slowly added until precipitation of a viscous oil stopped. The crude oil was recrystallized from acetone afford the title compound (72.0 g, 55%) as a white solid. $^1$H NMR (300 MHz, (d-DMSO) δ: 12.0-13.0 (brs, 1H), 8.54 (d, J=7.8 Hz, 2H), 8.35 (d, J=8.1 Hz, 2H), 8.21 (dd, J=8.7, 2.1 Hz, 1H), 7.99 (t, J=7.8 Hz, 2H), 7.79 (t, J=7.8 Hz, 2H), 7.51 (d, J=8.7 Hz, 1H), 7.44 (d, J=2.1 Hz, 1H), 4.08 (s, 3H).

Example 10

Synthesis of 5-(5-((2-(1-ethylcyclopentyloxy)-2-oxoethoxy)carbonyl)-2-methoxyphenyl)-5H-dibenzo[b,d]thiophenium iodide

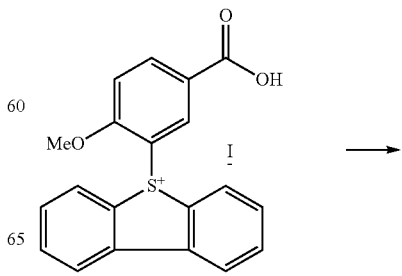

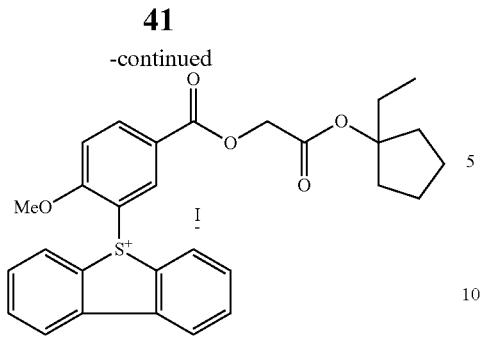

5-(5-carboxy-2-methoxyphenyl)-5H-dibenzo[b,d]thiophenium iodide (40.7 g, 88.0 mmol) and cesium carbonate (39.1 g, 0.120 mol, 1.5 eq) were suspended in dimethylformamide (500 mL) and cooled to 0° C. where 1-ethylcyclopentyl 2-bromoacetate (22.8 g, 96.8 mmol, 1.1 eq) was added dropwise. The reaction was taken off ice, stirred for 4 h, diluted with water (1 L) and extracted with dichloromethane (4×500 mL). The aqueous layer was discarded. The combined organic layers were washed with water (3×500 mL) and the combined aqueous extracts were back extracted with dichloromethane (2×400 mL). The combined organic layers were concentrated down to the residual dimethylformamide, poured slowly onto MTBE (1.75 L) and vigorously stirring to form a precipitate that was filtered and washed with MTBE (2×500 mL) to afford the title compound (52.9 g, 97%) as a white solid. $^1$H NMR (300 MHz, (CD$_3$)$_2$CO) δ: 8.52-8.59 (m, 4H), 8.38 (dd, J=8.7, 2.1 Hz, 1H), 8.05 (t, J=8.1 Hz, 2H), 7.96 (d, J=2.1 Hz, 1H), 7.85 (t, J=8.1 Hz, 2H), 7.60 (d, J=8.1 Hz, 1H), 4.75 (s, 2H), 4.12 (s, 3H), 2.02-2.12 (m, 2H), 1.97 (q, J=6.6 Hz, 2H), 1.55-1.70 (m, 6H), 0.86 (t, J=6.6 Hz, 3H).

Example 11

5-(5-((2-(1-ethylcyclopentyloxy)-2-oxoethoxy)carbonyl)-2-methoxyphenyl)-5H-dibenzo[b,d]thiophenium 3-hydroxyadamantane-acetoxy-1,1,2,2-tetrafluorobutane-1-sulfonate

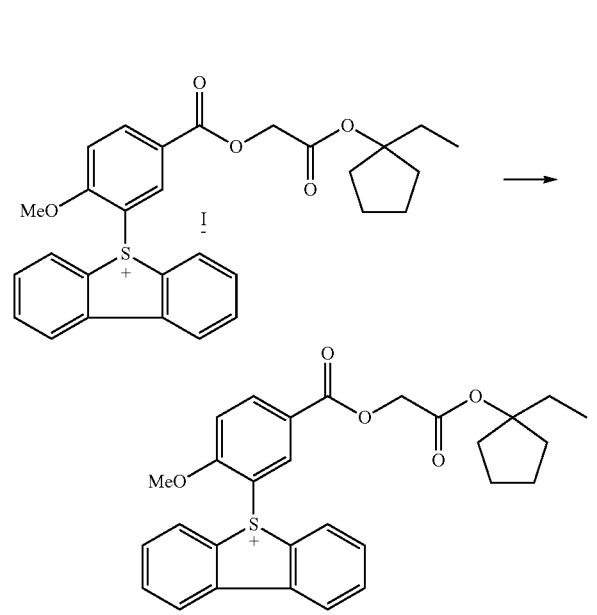

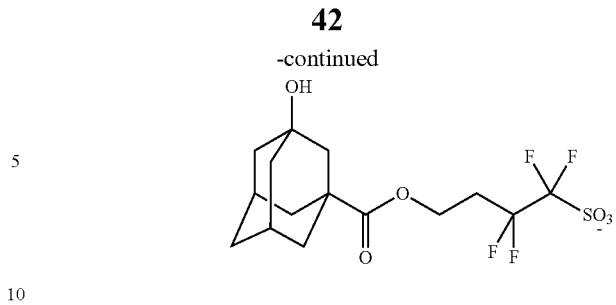

5-(5-((2-(1-ethylcyclopentyloxy)-2-oxoethoxy)carbonyl)-2-methoxyphenyl)-5H-dibenzo[b,d]thiophenium iodide (10.0 g, 16.2 mmol) and sodium 3-hydroxyadamantane-acetoxy-1,1,2,2-tetrafluorobutane-1-sulfonate (7.26 g, 17.0 mmol, 1.05 eq) were dissolved in dichloromethane (200 mL) and water (200 mL) and stirred at r.t. overnight. The dichloromethane layer was separated and the aqueous phase washed with dichloromethane (3×250 mL). The combined organic layers were washed with water (3×250 mL), concentrated in vacuo and azeotroped with acetonitrile (2×100 mL) to afford the title compound (13.3 g, 92%) as a white solid. $^1$H NMR (500 MHz, (CD$_3$)$_2$CO) δ: 8.56 (d, J=8 Hz, 2H), 8.44 (d, J=8 Hz, 2H), 8.40 (dd, J=9, 2 Hz, 1H), 8.06 (t, J=8 Hz, 2H), 7.99 (d, J=2 Hz, 1H), 7.86 (t, J=8 Hz, 2H), 7.60 (d, J=9 Hz, 1H), 4.76 (s, 2H), 4.31 (t, J=6.5 Hz, 2H), 4.10 (s, 3H), 3.56 (s, 1H), 2.69 (tt, J=18.5, 7 Hz, 2H), 2.01-2.07 (m, 2H), 1.97 (q, J=7.5 Hz, 2H), 1.55-1.81 (m, 18H), 0.86 (t, J=7.5 Hz, 3H).

Example 12

Synthesis of 5-(5-((2-(1-ethylcyclopentyloxy)-2-oxoethoxy)carbonyl)-2-methoxyphenyl)-5H-dibenzo[b,d]thiophenium 4-((4R)-4-((8R,9S,10S,13R,14S,17R)-10,13-dimethyl-3,7,12-trioxohexadecahydro-1H-cyclopenta[a]phenanthren-17-yl)pentanoyloxy)-1,1,2,2-tetrafluorobutane-1-sulfonate

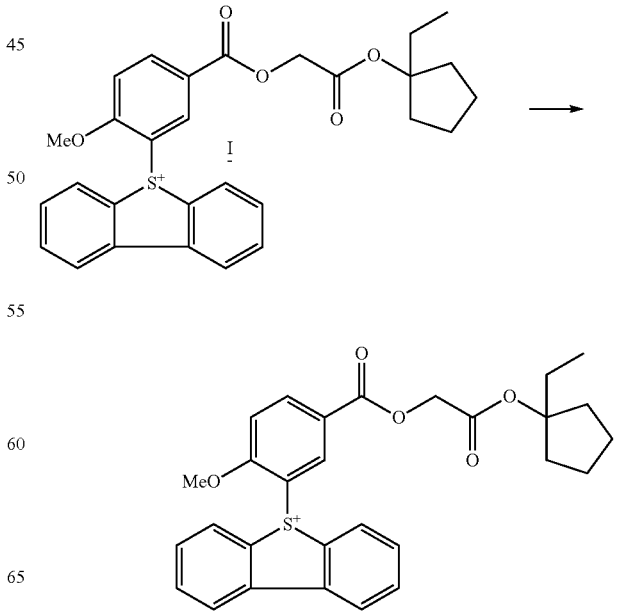

-continued

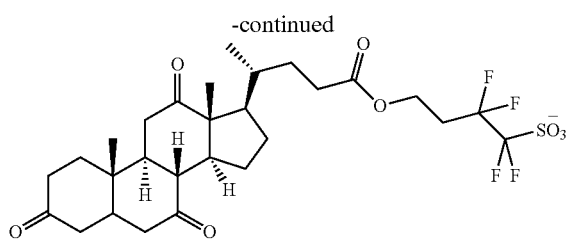

5-(5-((2-(1-ethylcyclopentyloxy)-2-oxoethoxy)carbonyl)-2-methoxyphenyl)-5H-dibenzo[b,d]thiophenium iodide (5.00 g, 8.80 mmol) and sodium 4-(((4R)-4-((8R,9S,10S,13R,14S,17R)-10,13-dimethyl-3,7,12-trioxohexadecahydro-1H-cyclopenta[a]phenanthren-17-yl)pentanoyloxy)-1,1,2,2-tetrafluorobutane-1-sulfonate (5.84 g, 9.24 mmol) were dissolved in dichloromethane (250 mL) and water (250 mL) and stirred at r.t. overnight. The dichloromethane layer was separated and the aqueous phase washed with dichloromethane (3×250 mL). The combined organic layers were washed with water (4×250 mL), concentrated in vacuo and residual water removed via azeotrope with acetonitrile (2×250 mL) to afford the title compound (8.10 g, 84%) as a white solid. $^1$H NMR (500 MHz, (CD$_3$)$_2$CO) δ: 8.56 (d, J=7.5 Hz, 2H), 8.44 (d, J=8.5 Hz, 2H), 8.40 (dd, J=8, 2 Hz, 1H), 8.06 (t, J=8 Hz, 2H), 7.99 (vis s, 1H), 7.86 (t, J=8 Hz, 2H), 7.60 (d, J=8.5 Hz, 1H), 4.75 (s, 2H), 4.31 (t, J=6.5 Hz, 2H), 4.10 (s, 3H), 3.06-3.17 (m, 2H), 2.94 (t, J=13 Hz, 1H), 2.64-2.82 (m, 4H), 2.20-2.52 (m, 7H), 1.73-2.10 (m, 14H), 1.55-1.69 (m, 7H), 1.48 (s, 3H), 1.28-1.39 (m, 5H), 1.11 (s, 3H), 0.83-0.89 (m, 6H).

Example 13

5-(5-((2-(1-ethylcyclopentyloxy)-2-oxoethoxy)carbonyl)-2-methoxyphenyl)-5H-dibenzo[b,d]thiophenium 1,1-difluoro-2-(methacryloyloxy)ethanesulfonate

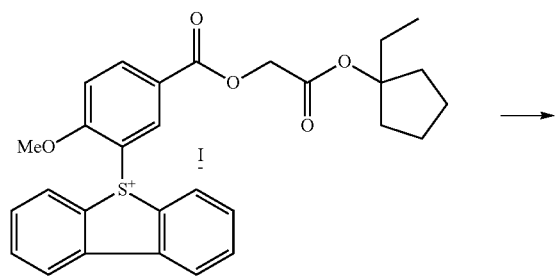

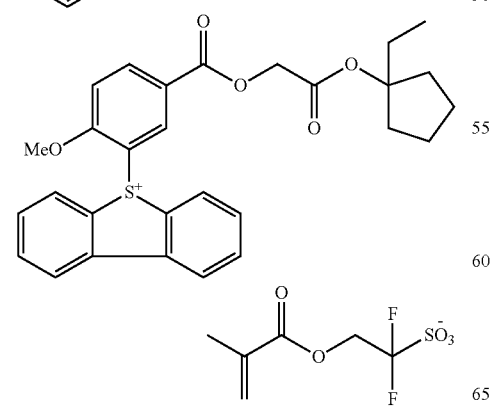

5-(5-((2-(1-ethylcyclopentyloxy)-2-oxoethoxy)carbonyl)-2-methoxyphenyl)-5H-dibenzo[b,d]thiophenium iodide (10.0 g, 16.2 mmol) and triethylammonium 1,1-difluoro-2-(methacryloyloxy)ethanesulfonate (5.64 g, 17.0 mmol, 1.05 eq) were dissolved in dichloromethane (200 mL) and water (200 mL) and stirred at r.t. overnight. The dichloromethane layer was separated and the aqueous phase washed with dichloromethane (3×250 mL). The combined organic layers were washed with water (3×250 mL), concentrated in vacuo and azeotroped with acetonitrile (2×100 mL) to afford the title compound (10.1 g, 86%) as a white hydroscopic solid. $^1$H NMR (300 MHz, (d-DMSO) δ: 8.52 (d, J=7.8 Hz, 2H), 8.35 (d, J=7.8 Hz, 2H), 8.27 (dd, J=8.1, 2.1 Hz, 1H), 7.98 (t, J=7.8 Hz, 2H), 7.78 (t, J=7.8 Hz, 2H), 7.55 (d, J=2.1 Hz, 1H), 7.54 (d, J=7.8 Hz, 1H), 6.09-6.13 (m, 1H), 5.76-5.79 (m, 1H), 4.74 (s, 2H), 4.62 (dd, J=15.6, 15.6 Hz, 2H), 4.05 (s, 3H), 1.83-1.98 (m, 7H), 1.45-1.65 (m, 6H), 0.79 (t, J=6.6 Hz, 3H).

Example 14

2-phenylpropan-2-yl 2-bromoacetate

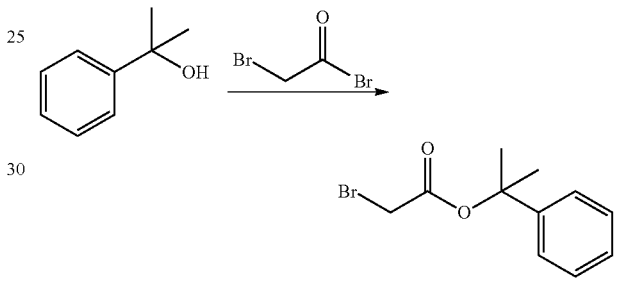

Pyridine (3.84 mL, 47.7 mmol) followed by bromoacetyl bromide (4.16 mL, 47.7 mmol) was added to a solution of 2-phenylpropan-2-ol (5.00 g, 36.7 mmol) in dichloromethane (100 mL) at 0° C., warmed to r.t. and stirred overnight. The reaction mixture was washed with water (3×100 mL), saturated aqueous sodium bicarbonate (3×100 mL), water (2×100 mL), dried (Na$_2$SO$_4$) and concentrated. The crude residue was purified by silica gel flash column chromatography (neutralized with TEA, heptanes) to afford the title compound (2.8 g (non-optimized), 30%) as a colorless oil. $^1$H NMR (300 MHz, ((CD$_3$)$_2$CO) δ: 7.44 (d, J=7.2 Hz, 2H), 7.34 (t, J=7.2 Hz, 2H), 7.25 (t, J=7.2 Hz, 1H), 4.01 (s, 2H), 1.78 (s, 6H).

Example 15

5-(3,5-dimethyl-4-(2-oxo-2-(2-phenylpropan-2-yloxy)ethoxy)phenyl)-5H-dibenzo[b,d]thiophenium bromide

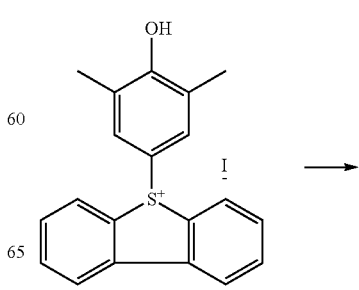

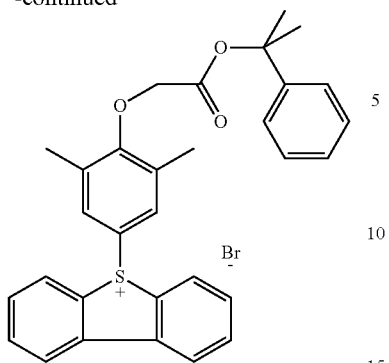

2-phenylpropan-2-yl 2-bromoacetate (1.96 g, 7.63 mmol) was added to a solution of 5-(4-hydroxy-3,5-dimethylphenyl)-5H-dibenzo[b,d]thiophenium iodide (3.00 g, 6.94 mmol) and cesium carbonate (2.94 g, 9.02 mmol) in DMF (40 mL) at 0° C., warmed to r.t. and stirred overnight. The reaction mixture was diluted with water (200 mL) and washed with DCM (3×200 mL). The organic layers were washed with water (3×300 mL), concentrate and poured onto MTBE. The precipitate was filtered and dried to afford the title compound (3.80 g, 97%) as a white solid. $^1$H NMR (300 MHz, ((CD$_3$)$_2$SO) δ: 8.52 (d, J=7.5 Hz, 2H), 8.33 (d, J=7.5 Hz, 2H), 7.96 (t, J=7.2 Hz, 2H), 7.5 (d, J=7.9 Hz, 2H), 7.20-7.39 (m, 5H), 4.61 (s, 2H), 2.19 (s, 6H), 1.71 (s, 6H).

Example 16

5-(3,5-dimethyl-4-(2-oxo-2-(2-phenylpropan-2-yloxy)ethoxy)phenyl)-5H-dibenzo[b,d]thiophenium 3-hydroxyadamantane-acetoxy-1,1,2,2-tetrafluorobutane-1-sulfonate 5-(3,5-dimethyl-4-(2-oxo-2-(2-phenylpropan-2-yloxy)ethoxy)phenyl)-5H-dibenzo[b,d]thiophenium bromide (1.8 g, 3.21 mmol) and sodium 3-hydroxyadamantane-acetoxy-1,1,2,2-tetrafluorobutane-1-sulfonate (1.44 g, 3.37 mmol) were dissolved in dichloromethane (100 mL) and water (100 mL) and stirred at r.t. overnight. The dichloromethane layer was separated and the aqueous phase washed with dichloromethane (3×100 mL). The combined organic layers were washed with water (6×200 mL) and concentrated in vacuo to afford the title compound (2.44 g, 86%) as a white solid. $^1$H NMR (500 MHz, ((CD$_3$)$_2$SO) δ: 8.53 (d, J=8 Hz, 2H), 8.35 (d, J=8 Hz, 2H), 8.03 (t, J=7 Hz, 2H), 7.83 (d, J=8 Hz, 2H), 7.51 (s, 2H), 7.40 (d, J=8 Hz, 2H), 7.31 (dt, J=8, 0.5 Hz, 2H), 7.24 (dt, J=7.5, 1 Hz, 1H), 4.65 (s, 2H), 4.31 (t, J=6.5 Hz, 2H), 2.80-2.82 (m, 2H), 2.65 (tt, J=14, 6.5 Hz, 2H), 2.29 (s, 6H), 1.72-1.81 (m, 10H), 1.65-1.67 (m, 4H), 1.56-1.59 (m, 2H).

Example 17

Synthesis of 5-(3,5-dimethyl-4-(2-oxo-2-(2-phenylpropan-2-yloxy)ethoxy)phenyl)-5H-dibenzo[b,d]thiophenium 4-((4R)-4-((8R,9S,10S,13R,14S,17R)-10,13-dimethyl-3,7,12-trioxohexadecahydro-1H-cyclopenta[a]phenanthren-17-yl)pentanoyloxy)-1,1,2,2-tetrafluorobutane-1-sulfonate

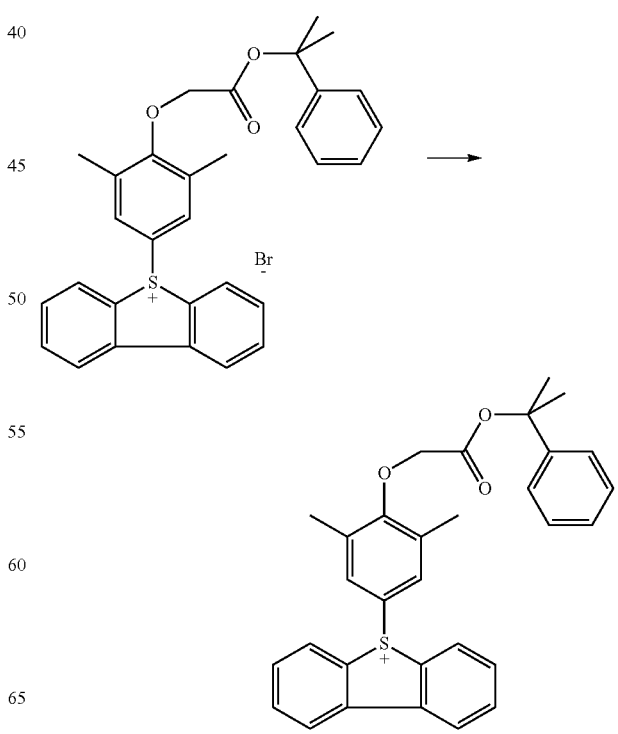

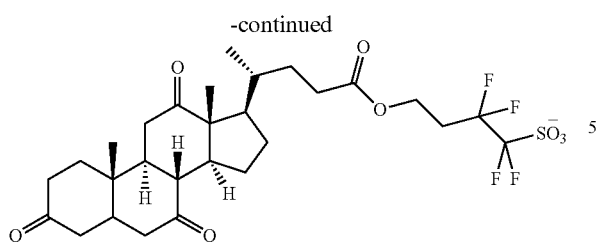

5-(3,5-dimethyl-4-(2-oxo-2-(2-phenylpropan-2-yloxy) ethoxy)phenyl)-5H-dibenzo[b,d]thiophenium bromide (1.8 g, 3.21 mmol) and sodium 4-((4R)-4-((8R,9S,10S,13R,14S,17R)-10,13-dimethyl-3,7,12-trioxohexadecahydro-1H-cyclopenta[a]phenanthren-17-yl)pentanoyloxy)-1,1,2,2-tetrafluorobutane-1-sulfonate (2.13 g, 3.37 mmol) were dissolved in dichloromethane (50 mL) and water (50 mL) and stirred at room temperature overnight. The dichloromethane layer was separated and the aqueous phase washed with dichloromethane (3×50 mL). The combined organic layers were washed with water (4×100 mL), concentrated in vacuo and residual water removed via azeotrope with acetonitrile (2×100 mL) to afford the title compound (2.77 g, 79%) as a white solid. $^1$H NMR (500 MHz, (CD$_3$)$_2$CO) δ: 8.53 (d, J=8 Hz, 2H), 8.35 (d, J=8 Hz, 2H), 8.04 (t, J=7.5 Hz, 2H), 7.83 (t, J=7.5 Hz, 2H), 7.50 (s, 2H), 7.40 (d, J=8 Hz, 2H), 7.31 (t, J=8 Hz, 2H), 7.24 (t, J=8 Hz, 1H), 4.65 (s, 2H), 4.32 (t, J=6.5 Hz, 2H), 3.05-3.17 (m, 2H), 2.94 (t, J=12.5 Hz, 1H), 2.64-2.82 (m, 5H), 2.21-2.53 (m, 12H), 1.72-2.10 (m, 17H), 1.56-1.65 (m, 1H), 1.47 (s, 3H), 1.28-1.38 (m, 5H), 1.10 (s, 3H), 0.83-0.87 (m, 3H).

Example 18

Synthesis of 5-(3,5-dimethyl-4-(2-oxo-2-(2-phenylpropan-2-yloxy)ethoxy)phenyl)-5H-dibenzo[b,d]thiophenium 1,1-difluoro-2-(methacryloyloxy)ethanesulfonate

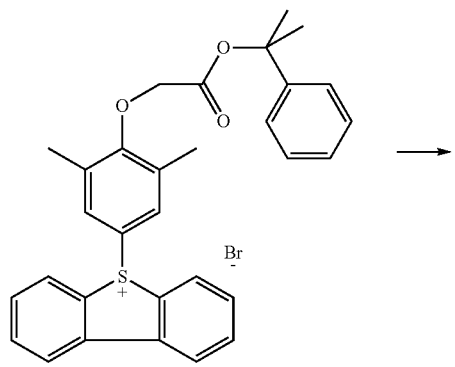

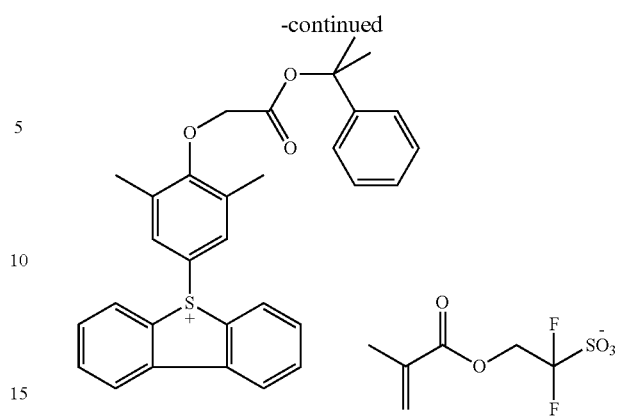

5-(3,5-dimethyl-4-(2-oxo-2-(2-phenylpropan-2-yloxy) ethoxy)phenyl)-5H-dibenzo[b,d]thiophenium bromide (7.00 g, 12.5 mmol) and triethylammonium 1,1-difluoro-2-(methacryloyloxy)ethanesulfonate (4.21 g, 12.7 mmol) were dissolved in dichloromethane (100 mL) and water (100 mL) and stirred at room temperature overnight. The dichloromethane layer was separated and the aqueous phase washed with dichloromethane (3×100 mL). The combined organic layers were washed with water (4×100 mL), concentrated in vacuo and residual water removed via azeotrope with acetonitrile (2×100 mL) to afford the title compound (7.07 g, 80%) as a white solid. $^1$H NMR (300 MHz, (CD$_3$)$_2$CO) δ: 8.53 (d, J=7.8 Hz, 2H), 8.37 (d, J=7.8 Hz, 2H), 8.03 (t, J=7.8 Hz, 2H), 7.82 (t, J=7.8 Hz, 2H), 7.52 (s, 2H), 7.40 (d, J=8.1 Hz, 2H), 7.32 (t, J=8.1 Hz, 2H), 7.26 (t, J=8.1 Hz, 1H), 6.12-6.19 (m, 1H), 5.68-5.71 (m, 1H), 4.76 (t, J=15.6 Hz, 2H), 4.66 (s, 2H), 2.28 (s, 6H), 1.94 (s, 3H), 1.77 (s, 6H).

Example 19

Preparation of polymer with acid generator units

Heel solution was made by dissolving 2-phenylpropan-2-yl methacrylate (0.39 g), 2-oxotetrahydrofuran-3-yl methacrylate (0.33 g), 3,5-bis(1,1,1,3,3,3-hexafluoro-2-hydroxypropan-2-yl)cyclohexyl methacrylate (0.57 g) and the monomer of Example 8 (0.31 g) in 12.81 g acetonitrile/tetrahydrofuran (2/1 v/v). Feed solution was prepared by dissolving 2-phenylpropan-2-yl methacrylate (185.54 g, 0.967 mol), 2-oxotetrahydrofuran-3-yl methacrylate (204.27, 1.26 mol), 3,5-bis(1,1,1,3,3,3-hexafluoro-2-hydroxypropan-2-yl)cyclohexyl methacrylate (127.98 g, 0.29 mol) and the monomer of Example 8 (81.5 g, 0.132 mol) in 606 g ethyl lactate:γ-butryl lactone (30/70 v/v). Initiator solution was prepared by dissolving 65.96 g initiator (V-65) in 66 g acetonitrile/tetrahydrofuran (2/1 v/v). The polymerization was carried out in a 2 L 3-neck round bottom flask fitted with a water condenser and a thermometer to monitor the reaction in the flask. The contents were stirred using an overhead stirrer. The reactor was charged with the heel solution and the contents were heated to 75° C. The feed solution and the initiator solution were fed into the reactor using syringe pump over a 4 hour time period. The contents were then stirred for additional 2 hours, whereby, the reaction was quenched using hydroquinone (2.0 g). The contents were cooled to room temperature and precipitated twice out of 10× (by weight) IPE/MeOH 95/5 (w/w). The polymer obtained was dried in vacuuo after each precipitation step at 50° C. for 24 hours to yield 500 g polymer Example 20

Further Preparation of Polymer with Acid Generator Units

The same process used for Example 19 was used in the preparation of polymer, except using the monomer of Example 2 was used in place of the monomer of Example 8.

Example 21

Further Preparation of Polymer with Acid Generator Units

The same process used for Example 19 was used in the preparation of polymer, except using the monomer of Example 13 was used in place of the monomer of Example 8.

Example 22

Preparation of Polymer without Acid Generator Units

Heel solution was made by dissolving 2-phenylpropan-2-yl methacrylate (1.94 g), 2-oxotetrahydrofuran-3-yl methacrylate (1.7 g), 3,5-bis(1,1,1,3,3,3-hexafluoro-2-hydroxypropan-2-yl)cyclohexyl methacrylate (2.81 g) in 72 g ethyl lactate:γ-butryl lactone (30/70 v/v). Feed solution was prepared by dissolving 2-phenylpropan-2-yl methacrylate (33.08 g), 2-oxotetrahydrofuran-3-yl methacrylate (35.97), 3,5-bis(1,1,1,3,3,3-hexafluoro-2-hydroxypropan-2-yl)cyclohexyl methacrylate (23.91 g) 94 g ethyl lactate:γ-butryl lactone (30/70 v/v). Initiator solution was prepared by dissolving 1 g initiator (V-65) in 11 g acetonitrile/tetrahydrofuran (2/1 v/v). The polymerization was carried out in a 2 L 3-neck round bottom flask fitted with a water condenser and a thermometer to monitor the reaction in the flask. The contents were stirred using an overhead stirrer. The reactor was charged with the heel solution and the contents were heated to 75° C. The feed solution and the initiator solution were fed into the reactor using syringe pump over a 4 hour time period. The contents were then stirred for additional 2 hours, whereby, the reaction was quenched using hydroquinone (1.0 g). The contents were cooled to room temperature and precipitated twice out of 10× (by weight) IPE/MeOH 95/5 (w/w). The polymer obtained was dried in vacuuo after each precipitation step at 50° C. for 24 hours to yield 100 g polymer.

Example 23

Preparation and Processing of Photoresist Composition

A positive-tone photoresist composition was prepared by combining 21.088 g of a 10 wt % solution of the polymer from Example 20 in ethyl lactate, 18.979 g of a 2 wt % solution of the acid generator compound of Example 1 above in ethyl lactate, 1.898 g of a 0.5 wt % solution of 1,1',1",1'"-(ethane-1,2-diylbis(azanetriyl))tetrapropan-2-ol in ethyl lactate, 0.422 g of a 0.5 wt % solution of fluorinated surfactant (Omnova PF656) in ethyl lactate, 47.342 g of ethyl lactate and 29.250 g of 2-hydroxyisobutyric acid methyl ester. The formulated resist was passed through a 0.01 μm PTFE filter. The thus prepared resist is spin coated onto a silicon wafer, soft baked to remove carrier solvent and exposed through a photomask to EUV radiation. The imaged resist layer is then baked at 110° C. for 60 seconds and then developed with an aqueous alkaline composition.

Example 24

Further Preparation and Processing of Photoresist Composition

A positive-tone photoresist composition was prepared by combining 24.038 g of a 10 wt % solution of the polymer from Example 19 in ethyl lactate, 40.865 g of a 2 wt % solution of the acid generator compound of Example 6 above in ethyl lactate, 5.288 g of a 0.5 wt % solution of 1,1',1",1'"-(ethane-1,2-diylbis(azanetriyl))tetrapropan-2-ol in ethyl lactate, 0.481 g of a 0.5 wt % solution of fluorinated surfactant (Omnova PF656) in ethyl lactate, 21.302 g of ethyl lactate and 38.025 g of 2-hydroxyisobutyric acid methyl ester. The formulated resist was passed through a 0.01 μm PTFE filter. The thus prepared resist is spin coated onto a silicon wafer, soft baked to remove carrier solvent and exposed through a photomask to EUV radiation. The imaged resist layer is then baked at 110° C. for 60 seconds and then developed with an aqueous alkaline composition.

Example 25

Further Preparation and Processing of Photoresist Composition

A positive-tone photoresist composition was prepared by combining 6.997 g of a 10 wt % solution of the polymer from Example 19 in ethyl lactate, 11.889 g of a 2 wt % solution of the acid generator compound of Example 6 above in ethyl lactate, 9.232 g of a 0.5 wt % solution of 1,1',1"-nitrilotripropan-2-ol in ethyl lactate, 0.140 g of a 0.5 wt % solution of fluorinated surfactant (Omnova PF656) in ethyl lactate, 0.041 g of ethyl lactate and 11.705 g of 2-hydroxyisobutyric acid methyl ester. The formulated resist was passed through a 0.01 μm PTFE filter. The thus prepared resist is spin coated onto a silicon wafer, soft baked to remove carrier solvent and exposed through a photomask to EUV radiation. The imaged resist layer is then baked at 110° C. for 60 seconds and then developed with an aqueous alkaline composition.

Example 26

Further Preparation and Processing of Photoresist Composition

A positive-tone photoresist composition was prepared by combining 4.757 g of a 10 wt % solution of the polymer from Example 19 in ethyl lactate, 10.021 g of a 2 wt % solution of the acid generator compound of Example 7 above in ethyl lactate, 6.279 g of a 0.5 wt % solution of 1,1',1"-nitrilotripropan-2-ol in ethyl lactate, 0.095 g of a 0.5 wt % solution of fluorinated surfactant (Omnova PF656) in ethyl lactate, 0.060 g of ethyl lactate and 8.788 g of 2-hydroxyisobutyric acid methyl ester. The formulated resist was passed through a 0.01 μm PTFE filter. The thus prepared resist is spin coated onto a silicon wafer, soft baked to remove carrier solvent and exposed through a photomask to EUV radiation. The imaged resist layer is then baked at 110° C. for 60 seconds and then developed with an aqueous alkaline composition.

Example 27

Further Preparation and Processing of Photoresist Composition

A positive-tone photoresist composition was prepared by combining 8.012 g of a 10 wt % solution of the polymer from Example 19 in ethyl lactate, 9.690 g of a 2 wt % solution of the acid generator compound of Example 11 above in ethyl lactate, 0.833 g of a 0.5 wt % solution of 1,1',1",1"'-(ethane-1,2-diylbis(azanetriyl))tetrapropan-2-ol in ethyl lactate, 0.160 g of a 0.5 wt % solution of fluorinated surfactant (Omnova PF656) in ethyl lactate, 9.604 g of ethyl lactate and 11.700 g of 2-hydroxyisobutyric acid methyl ester. The formulated resist was passed through a 0.01 μm PTFE filter. The thus prepared resist is spin coated onto a silicon wafer, soft baked to remove carrier solvent and exposed through a photomask to EUV radiation. The imaged resist layer is then baked at 110° C. for 60 seconds and then developed with an aqueous alkaline composition.

Example 28

Further Preparation and Processing of Photoresist Composition

A positive-tone photoresist composition was prepared by combining 4.815 g of a 10 wt % solution of the polymer from Example 21 in ethyl lactate, 13.002 g of a 2 wt % solution of the acid generator compound of Example 11 above in ethyl lactate, 1.589 g of a 0.5 wt % solution of 1,1',1",1"'-(ethane-1,2-diylbis(azanetriyl))tetrapropan-2-ol in ethyl lactate, 0.096 g of a 0.5 wt % solution of fluorinated surfactant (Omnova PF656) in ethyl lactate, 1.723 g of ethyl lactate and 8.775 g of 2-hydroxyisobutyric acid methyl ester. The formulated resist was passed through a 0.01 μm PTFE filter. The thus prepared resist is spin coated onto a silicon wafer, soft baked to remove carrier solvent and exposed through a photomask to EUV radiation. The imaged resist layer is then baked at 110° C. for 60 seconds and then developed with an aqueous alkaline composition.

Example 29

Further Preparation and Processing of Photoresist Composition

A positive-tone photoresist composition was prepared by combining 5.198 g of a 10 wt % solution of the polymer from Example 19 in ethyl lactate, 11.173 g of a 2 wt % solution of the acid generator compound of Example 17 above in ethyl lactate, 1.247 g of a 0.5 wt % solution of 1,1',1",1"'-(ethane-1,2-diylbis(azanetriyl))tetrapropan-2-ol in ethyl lactate, 0.104 g of a 0.5 wt % solution of fluorinated surfactant (Omnova PF656) in ethyl lactate, 3.503 g of ethyl lactate and 8.775 g of 2-hydroxyisobutyric acid methyl ester. The formulated resist was passed through a 0.01 μm PTFE filter. The thus prepared resist is spin coated onto a silicon wafer, soft baked to remove carrier solvent and exposed through a photomask to EUV radiation. The imaged resist layer is then baked at 110° C. for 60 seconds and then developed with an aqueous alkaline composition.

Example 30

Further Preparation and Processing of Photoresist Composition

A positive-tone photoresist composition was prepared by combining 4.938 g of a 10 wt % solution of the polymer from Example 19 in ethyl lactate, 0.148 g of a 0.5 wt % solution of 1,1',1",1"'-(ethane-1,2-diylbis(azanetriyl))tetrapropan-2-ol in ethyl lactate, 0.099 g of a 0.5 wt % solution of fluorinated surfactant (Omnova PF656) in ethyl lactate, 15.964 g of ethyl lactate and 8.852 g of 2-hydroxyisobutyric acid methyl ester. The formulated resist was passed through a 0.01 μm PTFE filter. The thus prepared resist is spin coated onto a silicon wafer, soft baked to remove carrier solvent and exposed through a photomask to EUV radiation. The imaged resist layer is then baked at 110° C. for 60 seconds and then developed with an aqueous alkaline composition.

Example 31

Further Preparation and Processing of Photoresist Composition

A positive-tone photoresist composition was prepared by combining 19.979 g of a 10 wt % solution of the polymer from Example 22 in ethyl lactate, 42.755 g of a 2 wt % solution of the acid generator compound of Example 6 above in ethyl lactate, 3.996 g of a 0.5 wt % solution of 1,1',1",1"'-(ethane-1,2-diylbis(azanetriyl))tetrapropan-2-ol in ethyl lactate, 0.400 g of a 0.5 wt % solution of fluorinated surfactant (Omnova PF656) in ethyl lactate, 21.233 g of ethyl lactate and 36.638 g of 2-hydroxyisobutyric acid methyl ester. The formulated resist was passed through a 0.01 μm PTFE filter. The thus prepared resist is spin coated onto a silicon wafer, soft baked to remove carrier solvent and exposed through a photomask to EUV radiation. The imaged resist layer is then baked at 110° C. for 60 seconds and then developed with an aqueous alkaline composition.

Example 32

LWR Analyses

Developed relief images of photoresist compositions as set forth above were evaluated for linewidth roughness (LWR) with results provided in Table 1 below. LWR values were determined by top-down scanning electron microscopy (SEM) using a Hitachi 9380 CD-SEM, operating at an accelerating voltage of 800 volts (V), probe current of 8.0 picoamperes (pA), using 200 Kx magnification at 1.0 digital zoom, with the number of frames set to 64. LWR was measured over a 2 μm line length in steps of 40 nm, and reported as the average LWR for the measured region.

TABLE 1

| Photoresist composition of Example # | LWR (nm) |
| --- | --- |
| Example 23 (comparative) | 5.8 |
| Example 24 | 3.4 |
| Example 25 | 5.3 |
| Example 26 | 4.2 |
| Example 27 | 4.2 |
| Example 28 | 4.7 |
| Example 29 | 5.2 |
| Example 30 | 5.7 |
| Example 31 | 4.5 |

What is claimed is:

1. A photoresist composition comprising:
   (a) a polymer comprising an acid generator bonded thereto; and
   (b) an acid generator compound that is not bonded to the polymer and that comprises a thioxanthone moiety or a dibenzothiophene moiety, and one or more acid-labile groups,
      wherein the (a) bonded acid generator comprises i) a thioxanthone moiety or a dibenzothiophene moiety, and ii) an acid-labile group;
      wherein the (a) bonded acid generator and/or the (b) acid generator compound comprise a sulfonium moiety and/or an iodonium moiety;
      wherein the (a) bonded acid generator comprises an anion component covalently bonded to the polymer;
      wherein the (a) bonded acid generator does not comprise a cation component covalently bonded to the polymer; and
      wherein the acid-labile group of the (b) acid generator compound is on a cation component of the acid generator compound.

2. The photoresist composition of claim 1 wherein the (a) bonded acid generator comprises an acid-labile ester group.

3. The photoresist composition of claim 1 wherein the (a) bonded acid generator comprises an acid-labile acetal group.

4. The photoresist composition of claim 1, wherein the one or more acid-labile groups of the (a) acid generator compound are each independently an optionally substituted ethylcyclopentyl ester, an optionally substituted methyladamantyl ester, an optionally substituted ethyl adamantyl ester, an optionally substituted t-butylester, an optionally substituted phenyl ester, or an optionally substituted naphthyl ester.

5. The photoresist composition of claim 1, wherein the one or more acid-labile groups of the (a) acid generator compound are each independently 1-ethylcyclopentyl or methyladamantyl.

6. The photoresist composition of claim 1, wherein the acid-labile group of the (b) acid generator compound is an optionally substituted ethylcyclopentyl ester, an optionally substituted methyladamantyl ester, an optionally substituted ethyl adamantyl ester, an optionally substituted t-butylester, an optionally substituted phenyl ester, or an optionally substituted naphthyl ester.

7. The photoresist composition of claim 1, wherein the acid-labile group of the (b) acid generator compound is 1-ethylcyclopentyl or methyladamantyl.

8. The photoresist composition of claim 1, wherein the (b) acid generator compound comprises an acid-labile ester group.

9. The photoresist composition of claim 1, wherein the (b) acid generator compound comprises an acid-labile acetal group.

10. A method for providing a photoresist relief image, comprising:
    a) applying a coating layer of a photoresist composition of claim 1 on a substrate; and
    b) exposing the photoresist composition layer to activating radiation and developing the exposed photoresist composition coating layer.

11. The method of claim 10 wherein the photoresist composition layer is exposed to EUV or e-beam radiation.

* * * * *